United States Patent
Obika

(10) Patent No.: US 8,981,413 B2
(45) Date of Patent: Mar. 17, 2015

(54) OPTICAL COMMUNICATION MODULE AND METHOD FOR MAKING THE SAME

(71) Applicant: Rohm Co., Ltd., Kyoto-shi, Kyoto (JP)

(72) Inventor: Akira Obika, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/188,064

(22) Filed: Feb. 24, 2014

(65) Prior Publication Data

US 2014/0239330 A1 Aug. 28, 2014

(30) Foreign Application Priority Data

Feb. 25, 2013 (JP) .................................. 2013-034897

(51) Int. Cl.
G02B 6/42 (2006.01)
H01L 33/54 (2010.01)
H01L 31/0232 (2014.01)
H01L 33/58 (2010.01)
H01L 31/18 (2006.01)

(52) U.S. Cl.
CPC .......... *H01L 31/02325* (2013.01); *H01L 33/58* (2013.01); *H01L 31/18* (2013.01); *H01L 31/0232* (2013.01)
USPC ............. 257/98; 257/116; 257/432; 257/434; 438/27; 438/31; 438/65

(58) Field of Classification Search
CPC .................................................. H01L 31/0232
USPC ........... 257/98, 116, 432, 434; 438/27, 31, 65
See application file for complete search history.

(56) References Cited

U.S. PATENT DOCUMENTS 6,602,427 B1 * 8/2003 Tu ...................................... 216/2
7,775,727 B2 8/2010 Hamasaki et al.

FOREIGN PATENT DOCUMENTS

JP 4406447 11/2009

* cited by examiner

*Primary Examiner* — Evan Pert
(74) *Attorney, Agent, or Firm* — Hamre, Schumann, Mueller & Larson, P.C.

(57) ABSTRACT

An optical communication module includes an optical semiconductor element. The element includes an optical functional region having a light receiving function or a light emitting function, a first transmission layer transmissive to light emitted from the optical functional region or light received by the optical functional region, and a wiring layer stacked on the first transmission layer and constituting a conduction path to the optical functional region. The communication module also includes a second transmission layer transmissive to the light and disposed to cover the optical semiconductor element, and a first resin member stacked on the second transmission layer. The communication module is formed with a fixing hole for fixing an optical fiber. The fixing hole includes a bottom face provided by the second transmission layer, and an opening formed in an outer surface of the first resin member.

32 Claims, 38 Drawing Sheets

OPTICAL COMMUNICATION MODULE AND METHOD FOR MAKING THE SAME

BACKGROUND OF THE INVENTION

1. Field of the Invention

The present invention relates to an optical communication module and a method for making the same.

2. Description of the Related Art

Methods of transmitting signals utilizing light as carrier wave have been known. For example, Japanese Patent No. 4406447 discloses an optical communication module employed for such a transmitting method. The optical communication module according to the document includes optical semiconductor elements such as a light emitting element and a photodetector. To transmit the light from the light emitting element or to transmit the light toward the photodetector, an optical fiber is employed. In the optical communication module, the optical semiconductor element is mounted on an optical fiber holder in a manner such that the optical functional region for emitting and receiving the light exposed in the optical semiconductor element. The optical fiber is fixed to the optical fiber holder in a manner such that the end face of the optical fiber confronts the optical functional region.

According to Japanese Patent No. 4406447, the optical fiber holder includes openings respectively formed in the front and rear faces thereof, so that the optical fiber can be accurately positioned with respect to the optical semiconductor element. The optical semiconductor element is mounted to the surface of the optical fiber holder, with the optical functional region opposed to the opening. Accordingly, the optical functional region is exposed in the rear face of the optical fiber holder, through the opening. Thus, the optical functional region and the optical fiber can be positioned with each other upon inserting the optical fiber in the opening. When inserting the optical fiber, a light-transmissive resin is introduced in the opening. The resin serves to fix the optical fiber and fill in the space between the optical functional region and the optical fiber. Then upon implementing components such as a control IC for the optical semiconductor element on a substrate together with the optical fiber holder including the optical fiber and the optical semiconductor element, the optical communication module can be obtained.

To protect the control IC and other components, a cover member for covering the control IC has to be attached, or a molding resin has to be provided. Although it is preferable to employ the molding resin from the viewpoint of reduction in cost and size of the module, it is difficult to provide the molding resin only in the region other than where the optical fiber is located. Further, the components constituting the optical communication module have to be collectively implemented on the substrate, from the viewpoint of production efficiency. In this case, however, the space for the optical fiber has to be secured, which hinders high density mounting of the components.

SUMMARY OF THE INVENTION

The present invention has been proposed under the circumstances described above. It is therefore an object of the present invention to provide a compact optical communication module that can be produced with greater efficiency and lower costs. It is also an object of the present invention to provide a method of manufacturing such an optical communication module.

According to a first aspect of the present invention, there is provided an optical communication module including: an optical semiconductor element that includes an optical functional region having a light receiving function or a light emitting function a first transmission layer made of a material transmissive to light emitted from the optical functional region or light received by the optical functional region and a wiring layer stacked on the first transmission layer and constituting a conduction path to the optical functional region; a second transmission layer made of a material transmissive to the light and disposed to cover the optical semiconductor element; a first resin member stacked on the second transmission layer; and a fixing hole for fixing an optical fiber, the fixing hole including a bottom face provided by the second transmission layer, and an opening formed in an outer surface of the first resin member.

Preferably, the bottom face and the optical functional region overlap each other when viewed in an axial direction of the fixing hole.

Preferably, the optical communication module according to the first aspect further includes an inner cylindrical portion connected to the opening, and a discontinuous portion located between the inner cylindrical portion and the bottom face, where the discontinuous portion is discretely connected to the inner cylindrical portion.

Preferably, the discontinuous portion is larger in cross-sectional size than the inner cylindrical portion.

Preferably, the discontinuous portion is shorter in axial length than the inner cylindrical portion.

Preferably, the inner cylindrical portion has a circular cross-sectional shape.

Preferably, the inner cylindrical portion has a constant diameter.

Preferably, the first resin member is non-transmissive to the light.

Preferably, the wiring layer is formed with an opening for passing the light.

Preferably, the optical communication module according to the first aspect further includes a redistribution layer located between the second transmission layer and the first resin member, and electrically connected to the wiring layer.

Preferably, the redistribution layer includes an internal electrode.

Preferably, the optical communication module according to the first aspect further includes an electrode pillar made of an electroconductive material, where the electrode pillar is stacked on the internal electrode and extends in an axial direction of the fixing hole.

Preferably, the electrode pillar is smaller in cross-sectional size than the internal electrode.

Preferably, the optical communication module according to the first aspect further includes a secondary substrate that supports the optical semiconductor element.

Preferably, the secondary substrate is made of a semiconductor.

Preferably, the optical communication module according to the first aspect further includes a second resin member, where the second resin member covers at least a part of the first resin member and exposes the opening of the fixing hole.

Preferably, the second resin member is non-transmissive to the light.

Preferably, the second resin member includes a surface flush with a surface of the first resin member in which the opening of the fixing hole is formed.

Preferably, the optical communication module according to the first aspect further includes a control IC covered with the second resin member and electrically connected to the optical semiconductor element.

Preferably, the optical semiconductor element and the control IC are arranged along a plane including an axial direction of the fixing hole.

Preferably, the optical semiconductor element and the control IC are arranged along a plane perpendicular to the axial direction of the fixing hole.

Preferably, the optical communication module according to the first aspect further includes a main substrate for supporting the optical semiconductor element, the control IC, the first resin member, and the second resin member.

Preferably, the optical communication module according to the first aspect further includes a wire for electrically connecting the optical semiconductor element and the control IC to each other.

Preferably, the optical communication module according to the first aspect further includes an additional redistribution layer for electrically connecting the optical semiconductor element and the control IC each other.

According to a second aspect of the present invention, there is provided a method of manufacturing an optical communication module, where the method includes the steps of: preparing an optical semiconductor element that includes an optical functional region having a light receiving function or a light emitting function a first transmission layer made of a material transmissive to light emitted from the optical functional region or light received by the optical functional region and a wiring layer stacked on the first transmission layer and constituting a conduction path to the optical functional region; forming a second transmission layer and a redistribution layer, where the second transmission layer is made of a material transmissive to the light and covering the first transmission layer and the wiring layer, and where the redistribution layer has a portion stacked on the second transmission layer, is electrically connected to the wiring layer, and includes a cover portion for blocking the light; forming a cover pillar standing upright on the cover portion; forming a first resin intermediate covering the cover pillar; forming a first resin member by collectively removing a part of the first resin intermediate and a part of the cover pillar, the first resin member being configured to expose a part of the cover pillar; and removing the cover pillar and the cover portion.

Preferably, the cover pillar is formed by a plating process performed in the forming step of the cover pillar.

Preferably, the cover pillar and the cover portion are removed by an etching process performed in the removing step of the cover pillar and the cover portion.

Preferably, the forming of the redistribution layer includes forming an internal electrode electrically connected to the optical semiconductor element, and the forming of the cover pillar includes collectively forming electrode pillars standing upright on internal electrodes, respectively.

Preferably, the method according to the second aspect further includes the step of selectively reducing a height of the electrode pillar alone after the forming of the cover pillar and before the forming of the first resin intermediate.

Preferably, the method according to the second aspect further includes the step of exposing a part of the cover pillar by collectively removing a part of the first resin intermediate and a part of the electrode pillar after the step of forming the first resin intermediate and before the step of removing the cover pillar and the cover portion.

Preferably, the method according to the second aspect further includes the step of exposing a part of the electrode pillar by collectively removing a part of the first resin intermediate and a part of the electrode pillar after the step of removing the cover pillar and the cover portion.

Preferably, the step of exposing a part of the electrode pillar is performed by polishing.

Other features and advantages of the present invention will be clearer from the detailed description given below with reference to the accompanying drawings.

DETAILED DESCRIPTION OF THE PREFERRED EMBODIMENTS

Embodiments of the present invention will be described below with reference to the drawings.

Figure 1:
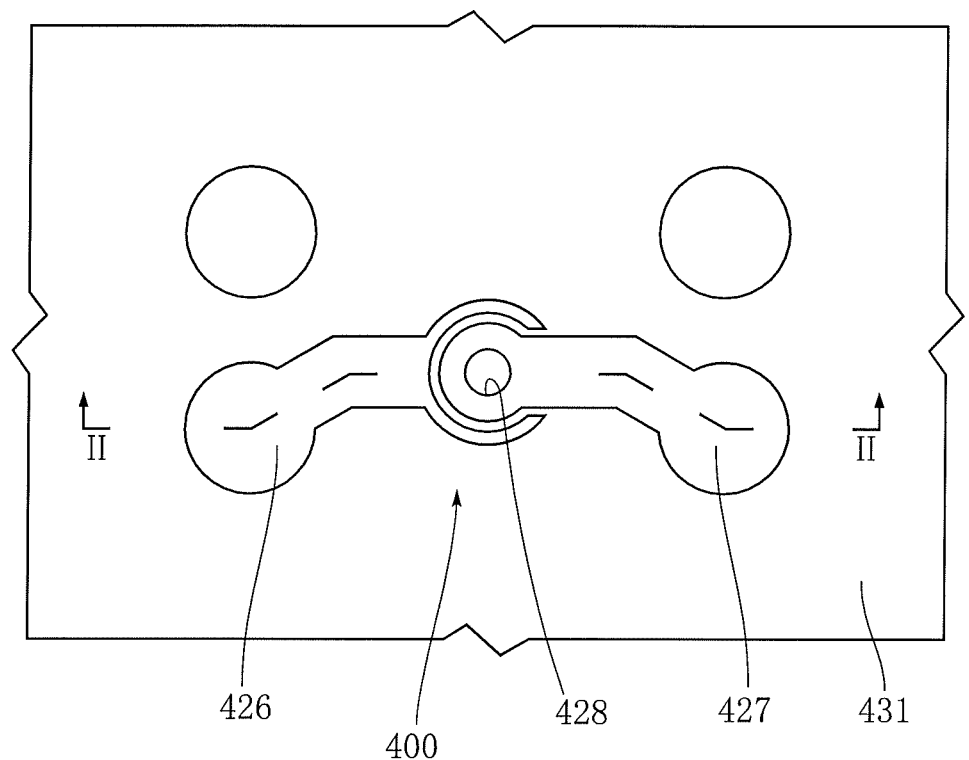
FIG. 1 is a plan view of principal parts for explaining a manufacturing method of an optical communication module according to a first embodiment of the present invention.
Figure 2:
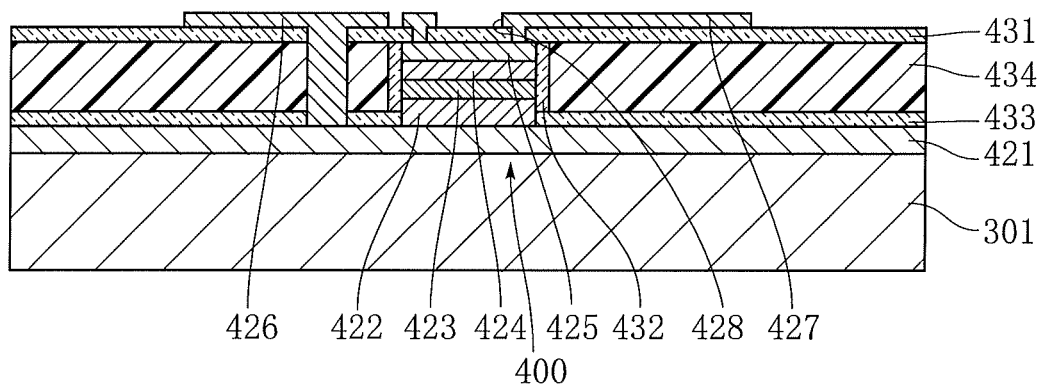
FIG. 2 is a cross-sectional view of principal parts, taken along a line II-II in FIG. 1.

FIGS. 1 to 15 illustrate a manufacturing method of an optical communication module according to a first embodiment of the present invention. First, as shown in FIGS. 1 and 2, optical semiconductor elements 400 are prepared. In the present embodiment, a predetermined number of optical semiconductor elements each as the one illustrated in the figures are formed on a secondary substrate material 301. The secondary substrate material 301 is made of GaAs, for example.

The optical semiconductor element 400 includes an optical functional region having a light emitting function and/or a photo-detecting function. Examples of the optical semiconductor element 400 having the light emitting function include a light-emitting diode (LED) and a vertical cavity surface emitting laser (VCSEL). Examples of the optical semiconductor element 400 having the photodetecting function include a photodiode. The following description describes the optical semiconductor element 400 configured as VCSEL.

The optical semiconductor element 400, having a configuration of a known VCSEL, includes, for example, an n-type contact layer 421, an n-type distributed Bragg reflector (DBR) layer 422, an active layer 423, a p-type DBR layer 424, a p-type contact layer 425, a first dielectric transmission layer 431, an n-type internal electrode 426, and a p-type internal electrode 427.

The active layer 423 emits light by combination of electrons and holes. In the present application, the term "optical functional region" refers to the active layer 423 itself, or a region including the active layer 423 and the vicinity thereof. The n-type DBR layer 422 and the p-type DBR layer 424 are stacked on each other with the active layer 423 disposed therebetween. While the active layer 423 emits various wavelengths of light, the n-type DBR layer 422 and the p-type DBR layer 424 are configured to cause only light of a specific wavelength to resonate in the stacking direction of these layers, thereby outputting a laser beam of the light in the stacking direction. The n-type contact layer 421 and the p-type contact layer 425 are stacked via the n-type DBR layer 422 and the p-type DBR layer 424, and are formed of, for example, a doped semiconductor material (GaAs in the illustrated embodiment). The n-type contact layer 421 is formed on the secondary substrate material 301.

As stated above, a plurality of optical semiconductor elements 400 are provided on the secondary substrate material 301. Any two optical semiconductor elements 400 adjacent to each other are configured in a manner such that the n-type DBR layer 422, the active layer 423, the p-type DBR layer 424, and the p-type contact layer 425 of one optical semiconductor element are isolated from the counterpart layers of the other optical semiconductor element by dielectric layers 432, 433 and 434. As shown in FIG. 2, the dielectric layer 432 is disposed so as to horizontally surround the n-type DBR layer 422, the active layer 423, the p-type DBR layer 424, and the p-type contact layer 425 of the optical semiconductor element 400. The dielectric layer 432 is formed of $SiO_2$, for example. The dielectric layer 433 is stacked on the n-type contact layer 421 and formed of $SiO_2$, for example. The dielectric layer 434 is stacked on the dielectric layer 433, and formed of a polyimide resin, for example.

The first dielectric transmission layer 431 is stacked on the p-type contact layer 425 and the dielectric layer 434, and formed of a material that transmits the light from the active layer 423, such as $SiO_2$. The first dielectric transmission layer 431 is an example of the "first transmission layer" in the present invention. The n-type internal electrode 426 and the p-type internal electrode 427 correspond to the wiring layer in the present invention. The n-type internal electrode 426 is stacked on the first dielectric transmission layer 431, and formed of a metal such as Au. The n-type internal electrode 426 is electrically connected to the n-type contact layer 421 through a contact hole formed in the first dielectric transmission layer 431 and the dielectric layers 434, 433.

The p-type internal electrode 427 is stacked on the first dielectric transmission layer 431, and formed of a metal such as Au. The p-type internal electrode 427 is electrically connected to the p-type contact layer 425 through a contact hole formed in the first dielectric transmission layer 431.

Referring to FIG. 1, as viewed in plan, the p-type internal electrode 427 may include a circular portion on the right, another circular portion at the center of the figure, and a belt-like portion connecting the two circular portions to each other. The circular portion at the center of the figure is formed with an opening 428. The opening 428 has a circular shape for example, and located so as to overlap the active layer 423 in a plan view, as shown in FIG. 2. The light from the active layer 423 is outputted upward through the opening 428. As viewed in plan, the n-type internal electrode 426 includes a circular portion on the left, an arcuate portion surrounding the central circular portion of the p-type internal electrode 427, and a belt-like portion connecting the two portions to each other.

Figure 3:
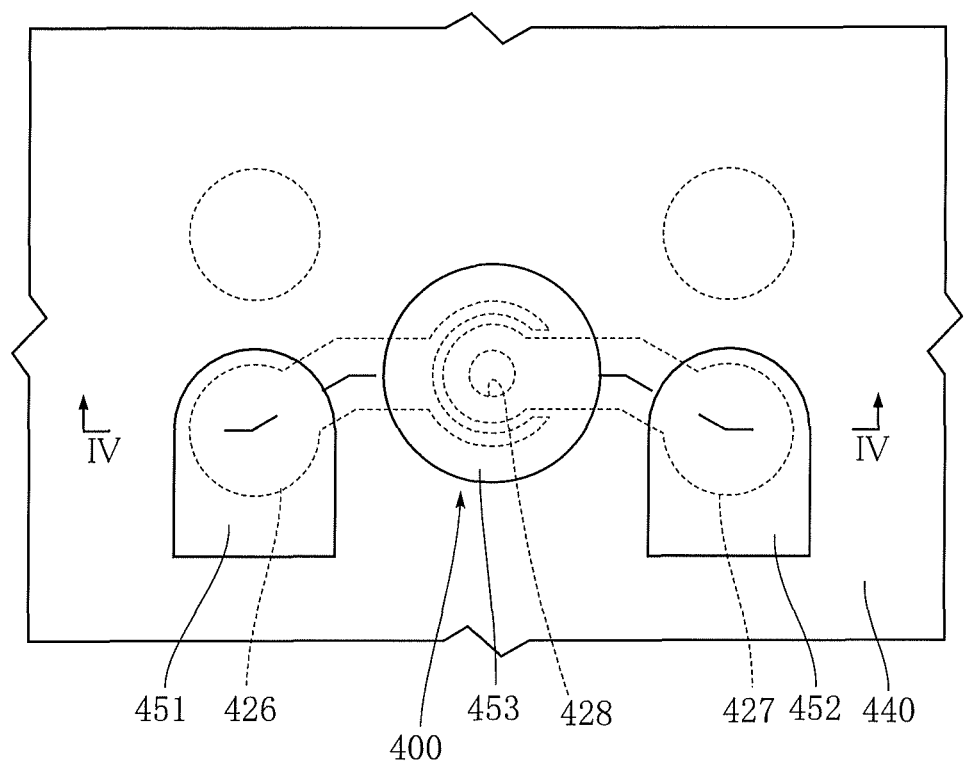
FIG. 3 is a plan view of principal parts for explaining the manufacturing method of the optical communication module according to the first embodiment.
Figure 4:
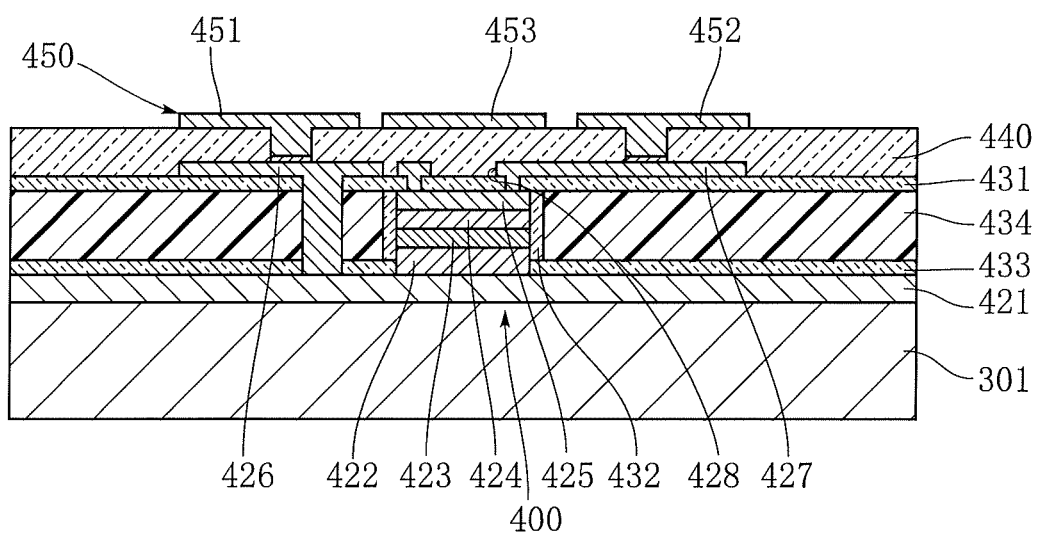
FIG. 4 is a cross-sectional view of principal parts, taken along a line IV-IV in FIG. 3.

Then a second dielectric transmission layer 440 and a redistribution layer 450 are formed, as shown in FIGS. 3 and 4. More specifically, a light transmission layer is formed so as to cover the n-type internal electrode 426, the p-type internal electrode 427, and the first dielectric transmission layer 431. The transmission layer is formed of a material that transmits the light from the active layer 423, and use is made of a polyimide resin in the illustrated embodiment. Then the transmission layer is patterned so as to form contact holes respectively communicating with the n-type internal electrode 426 and the p-type internal electrode 427. Thus, the second dielectric transmission layer 440 is obtained. The second dielectric transmission layer 440 is an example of the "second transmission layer" in the present invention. Thereafter, an Au layer is formed for example by a plating process, and the Au layer is subjected to patterning to provide the redistribution layer 450. It should be noted here that before the formation of the redistribution layer 450, a barrier layer is formed of e.g. Ni so as to cover exposed parts of the n-type internal electrode 426 and the p-type internal electrode 427 through the contact holes of the second dielectric transmission layer 440.

The redistribution layer 450 includes an n-type redistribution internal electrode 451, a p-type redistribution internal electrode 452, and a cover portion 453. As shown in FIG. 3, the n-type redistribution internal electrode 451 overlaps the left circular portion of the n-type internal electrode 426, and has a shape formed by combining a semicircular portion and a rectangular portion. The n-type redistribution internal electrode 451 is electrically connected to the n-type internal electrode 426 through the contact hole. The p-type redistribution internal electrode 452 overlaps the right circular portion of the p-type internal electrode 427, and has a shape formed by combining a semicircular portion and a rectangular portion. The p-type redistribution internal electrode 452 is electrically connected to the p-type internal electrode 427 through the contact hole.

The cover portion 453 is located so as to cover the entirety of the opening 428 of the p-type internal electrode 427 in a plan view, and has a circular shape for example. The cover portion 453 is not electrically connected to the n-type internal electrode 426 nor the p-type internal electrode 427. The cover portion 453 serves as a block to check the light proceeding from the active layer 423 through the opening 428.

Figure 5:
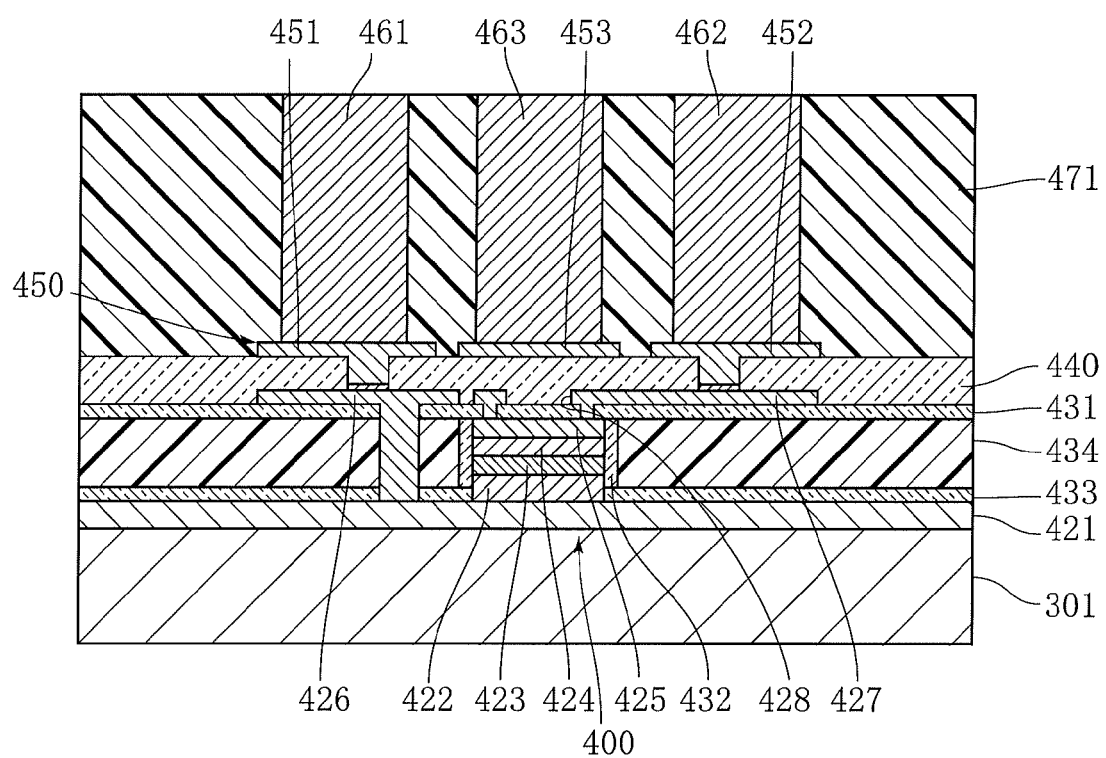
FIG. 5 is a cross-sectional view of principal parts for explaining the manufacturing method of the optical communication module according to the first embodiment.

Referring to FIG. 5, a pillar 461 for the n-type electrode, a pillar 462 for the p-type electrode, and a pillar 463 for the cover are formed. To form these pillars, for example, a resist layer 471 is formed so as to cover the second dielectric transmission layer 440 and the redistribution layer 450, and the resist layer 471 is patterned by a photolithography method to form through-holes respectively communicating with the n-type redistribution internal electrode 451, the p-type redistribution internal electrode 452, and the cover portion 453 of the redistribution layer 450. In this embodiment, these through-holes are slightly smaller in plan-view size than the n-type redistribution internal electrode 451, the p-type redistribution internal electrode 452, and the cover portion 453, respectively. By performing plating with Cu, for example, the n-type electrode pillar 461, the p-type electrode pillar 462 and the cover pillar 463, made of Cu, are obtained.

Figure 6:
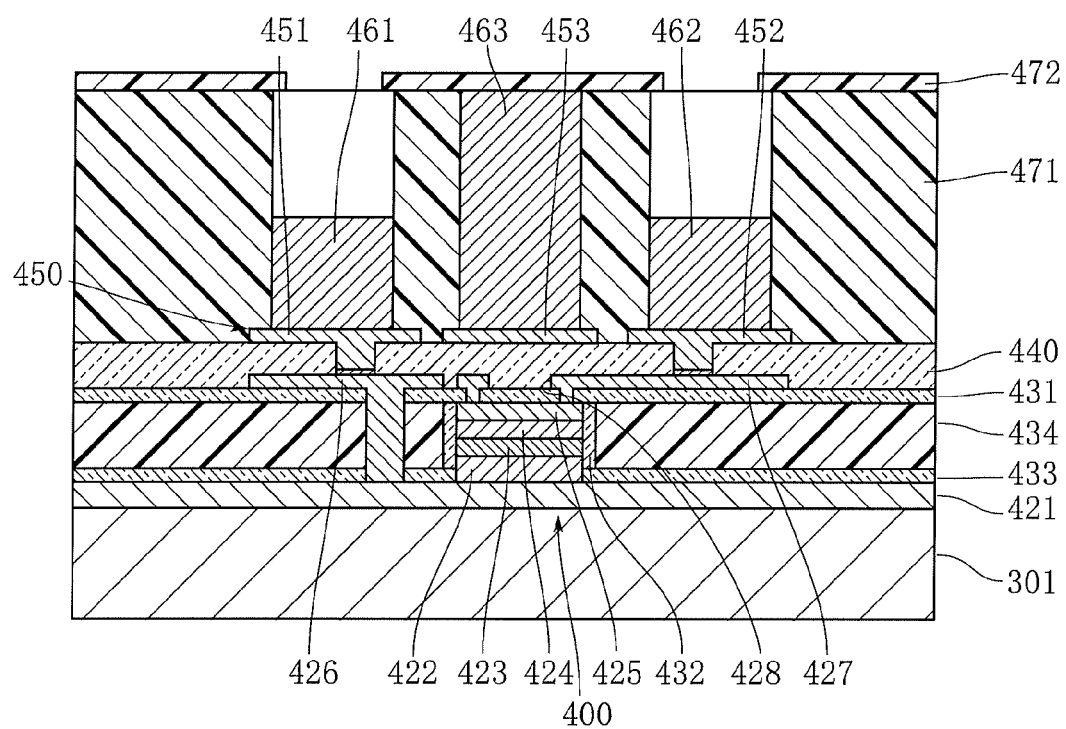
FIG. 6 is a cross-sectional view of principal parts for explaining the manufacturing method of the optical communication module according to the first embodiment.

As shown in FIG. 6, a resist layer 472 is formed so as to cover the n-type electrode pillar 461, the p-type electrode pillar 462, and the cover pillar 463. Then the resist layer 472 is patterned so as to form openings in which the n-type electrode pillar 461 and the p-type electrode pillar 462 are exposed. Then, selective etching of Cu is performed, so that only the n-type electrode pillar 461 and the p-type electrode pillar 462 are etched. Accordingly, the n-type electrode pillar 461 and the p-type electrode pillar 462 become shorter in height than the cover pillar 463.

Figure 7:
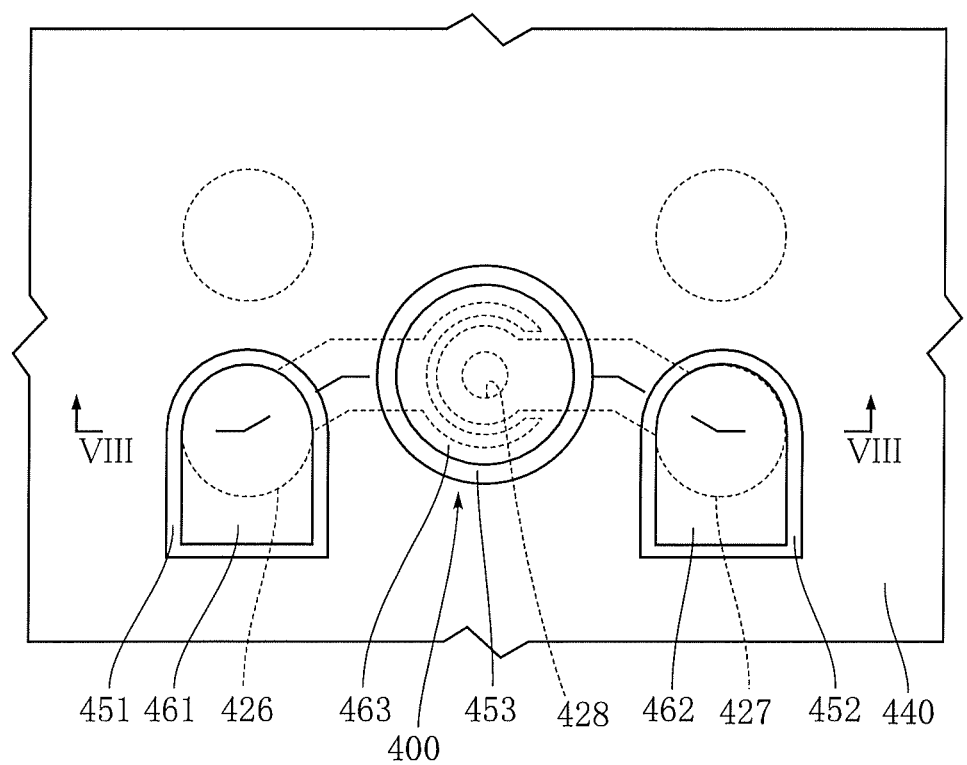
FIG. 7 is a plan view of principal parts for explaining the manufacturing method of the optical communication module according to the first embodiment.
Figure 8:
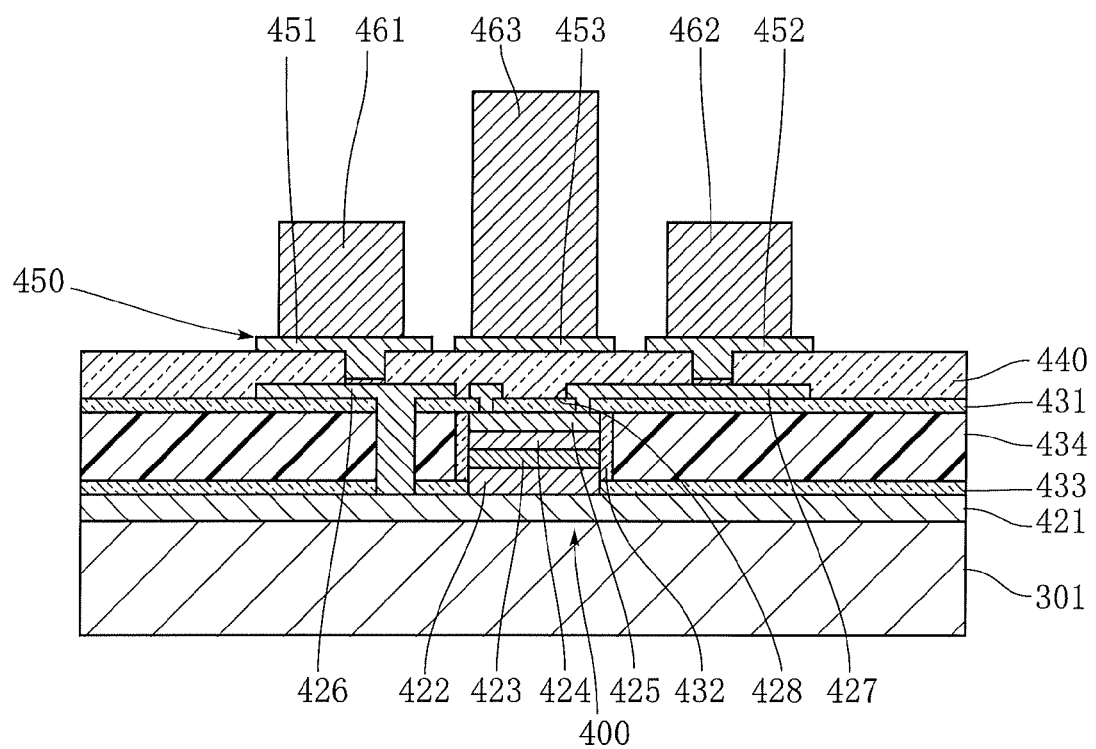
FIG. 8 is a cross-sectional view of principal parts, taken along a line VIII-VIII in FIG. 7.

FIGS. 7 and 8 illustrate the state obtained upon removing the resist layers 471, 472. As shown in FIGS. 7 and 8, the n-type electrode pillar 461, the p-type electrode pillar 462, and the cover pillar 463 stand upright on the n-type redistribution internal electrode 451, the p-type redistribution internal electrode 452, and the cover portion 453, respectively. The n-type electrode pillar 461 and the p-type electrode pillar 462 have a shape that is a combination of a semicircular portion and a rectangular portion in a plan view, and these pillars are slightly smaller in plan-view size than the n-type redistribution internal electrode 451 and the p-type redistribution internal electrode 452. In addition, the n-type electrode pillar 461 and the p-type electrode pillar 462 are enclosed in the n-type redistribution internal electrode 451 and the p-type redistribution internal electrode 452, respectively, in a plan view. The cover pillar 463 has a circular shape in a plan view, and is slightly smaller than the cover portion 453. The cover pillar 463 is also enclosed in the cover portion 453 in a plan view.

Figure 9:
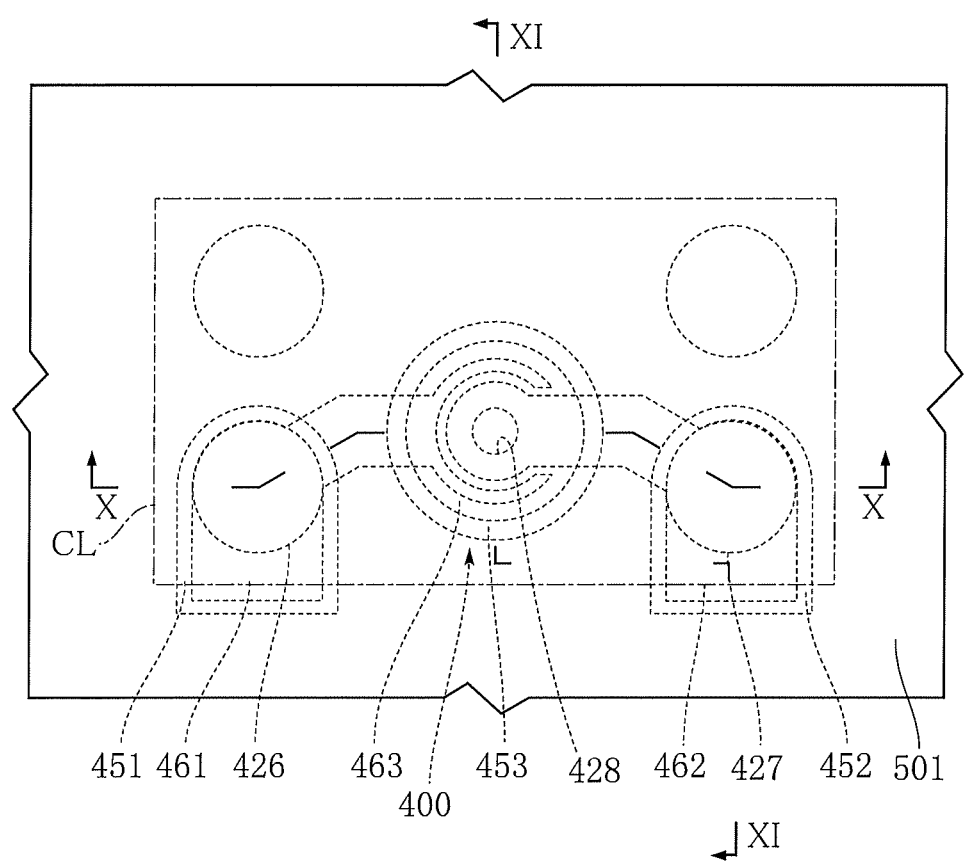
FIG. 9 is a plan view of principal parts for explaining the manufacturing method of the optical communication module according to the first embodiment.

As shown in FIG. 9, a first resin intermediate 501 is formed. The first resin intermediate 501 is a resin layer integrally formed so as to spread along the secondary substrate material 301, and covers the n-type electrode pillar 461, the p-type electrode pillar 462, the cover pillar 463, the redistribution layer 450, and the second dielectric transmission layer 440. In this embodiment, the first resin intermediate 501 is formed of a black epoxy resin for example, and hence non-transmissive to the light from the active layer 423. The collective cutting is then performed along the cutting line CL shown in FIG. 9. Accordingly, the secondary substrate material 301 and the first resin intermediate 501 are divided into pieces each having a rectangular plan-view shape. Thus, an intermediate product shown in FIGS. 10 and 11 is obtained.

Figure 10:
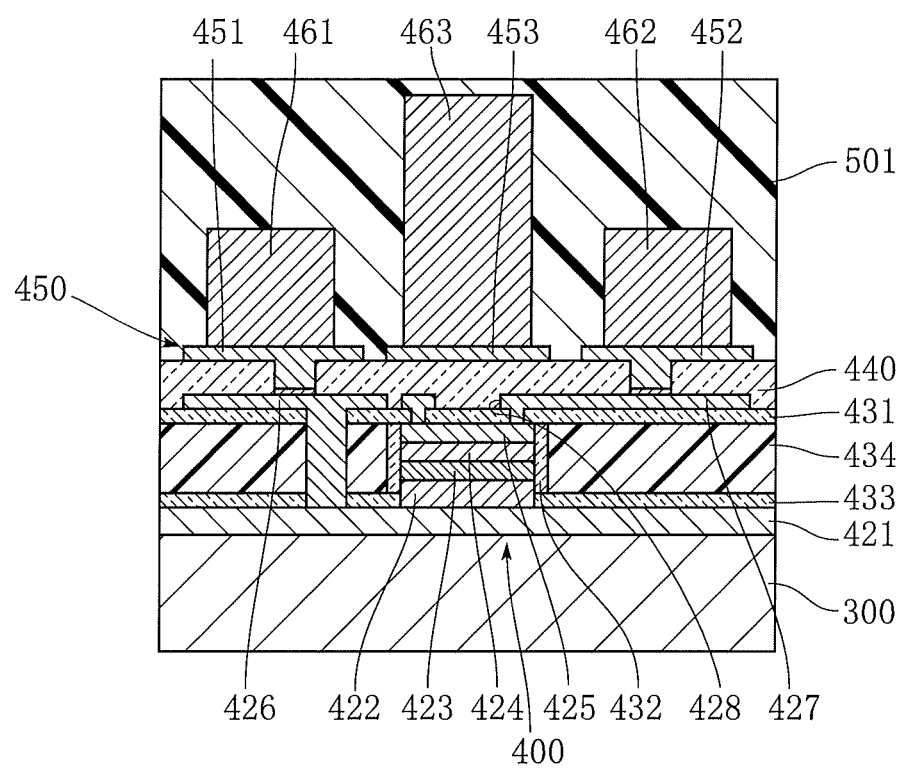
FIG. 10 is a cross-sectional view of principal parts, taken along a line X-X in FIG. 9.
Figure 11:
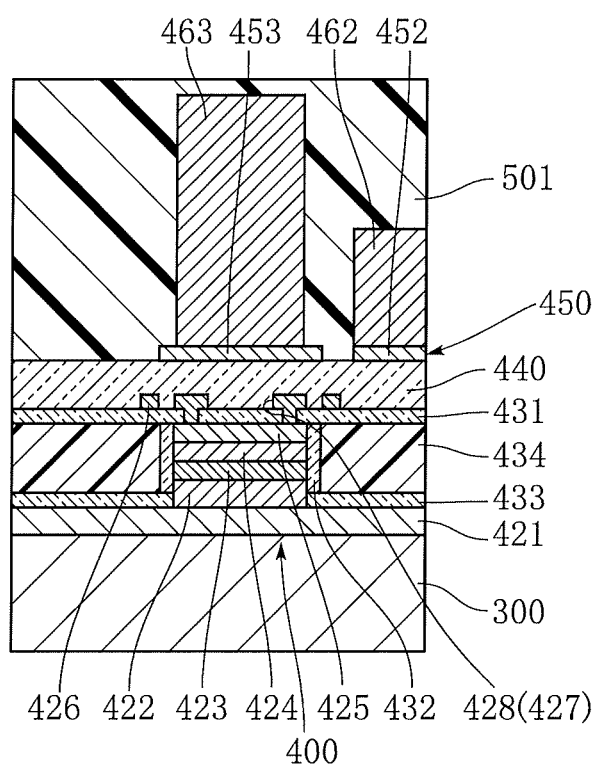
FIG. 11 is a cross-sectional view of principal parts, taken along a line XI-XI in FIG. 9.

Upon performing the cutting along the line CL, as shown in FIGS. 10 and 11, a part of each of the rectangular portions of the n-type electrode pillar 461 and the p-type electrode pillar 462 is cut off. As a result, the n-type electrode pillar 461 and the p-type electrode pillar 462 are exposed from the first resin intermediate 501, as is apparent from FIGS. 10 and 11. The exposed surface of the n-type electrode pillar 461 and the p-type electrode pillar 462 may be plated with Au, in preparation for a wire bonding process to be subsequently described. In the intermediate product, the cover pillar 463 is fully covered with the first resin intermediate 501, thereby being not exposed to outside.

Instead of the above method in the illustrated embodiment, a different manufacturing method may be adopted. For example, use may be made of a support substrate to form a structure in which the second dielectric transmission layer 440, the redistribution layer 450, the n-type electrode pillar 461, the p-type electrode pillar 462, the cover pillar 463, and the first resin intermediate 501 are integrally built, and the resulting structure may be coupled with the optical semiconductor element 400.

Figure 12:
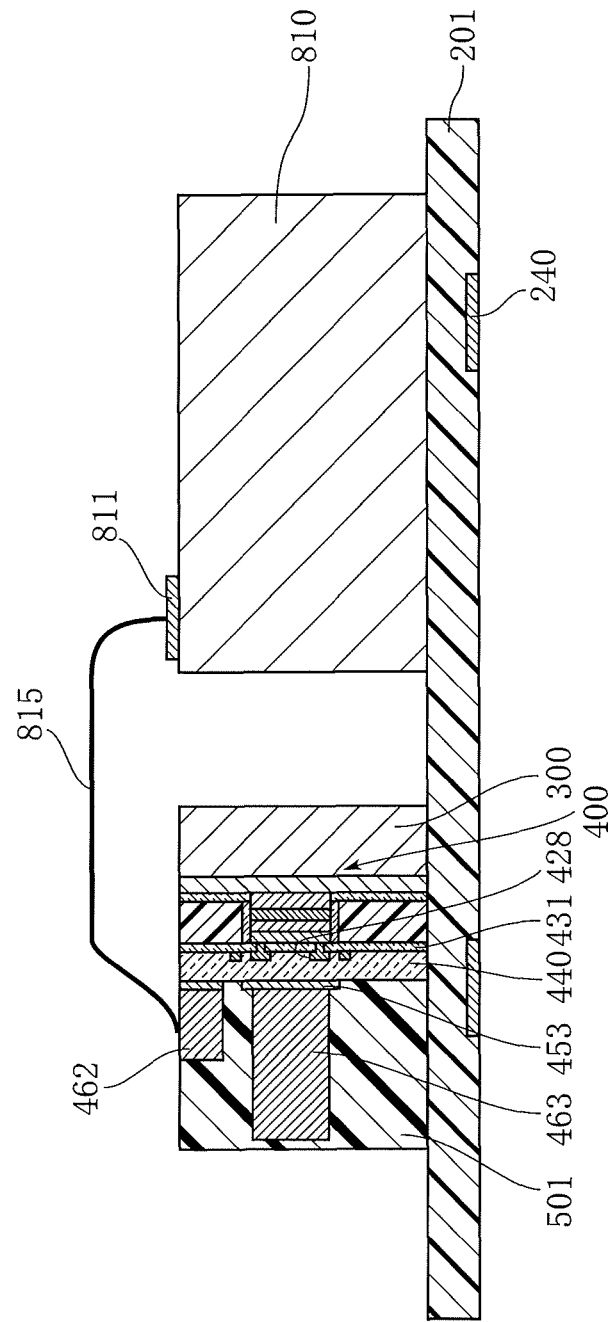
FIG. 12 is a cross-sectional view for explaining the manufacturing method of the optical communication module according to the first embodiment.

As shown in FIG. 12, a main substrate material 201 and a control IC 810 are prepared. The main substrate material 201 is, for example, a printed circuit board and has a size allowing a plurality of the intermediate products to be mounted thereon. The main substrate material 201 includes a plurality of electrodes 240 formed on the back surface. The control IC 810 is configured to control the optical semiconductor element 400. A plurality of sets of the intermediate products and the control ICs 810 are mounted on the surface of the main substrate material 201 via e.g. a bonding layer (not shown), such that the intermediate product and the corresponding control IC 810 are located adjacent to each other. The intermediate product is mounted such that the exposed surfaces of the n-type electrode pillar 461 and the p-type electrode pillar 462 are oriented upward. The control IC 810 is mounted such that an electrode 811 provided thereon is oriented upward. Then the electrode 811 and the exposed surfaces of the n-type electrode pillar 461 and the p-type electrode pillar 462 are connected via a wire 815, by wire bonding. Here, additional wire bonding may be performed to connect an interconnect pattern formed on the main substrate material 201 to the control IC 810 and the intermediate product.

Figure 13:
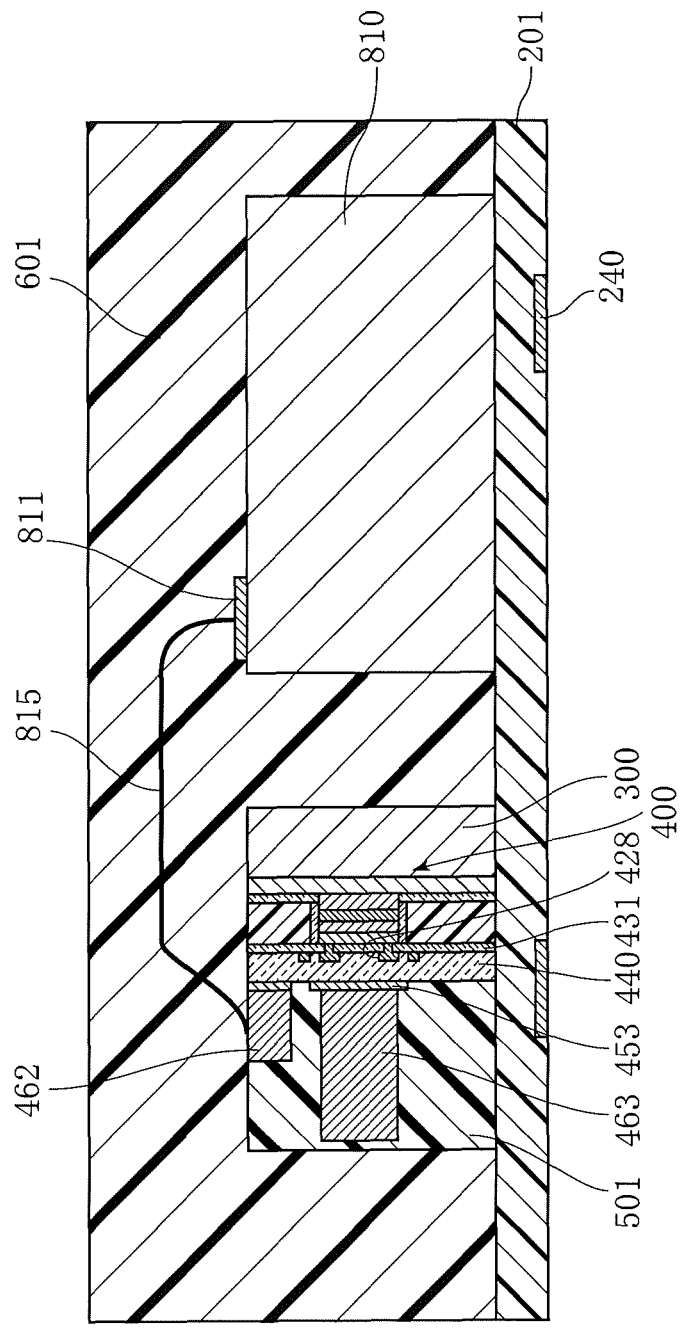
FIG. 13 is a cross-sectional view for explaining the manufacturing method of the optical communication module according to the first embodiment.

Then a second resin intermediate 601 is formed as shown in FIG. 13. The second resin intermediate 601 may be obtained, for example, by forming a layer of a black epoxy resin on the main substrate material 201, so as to collectively cover the plurality of intermediate products and the plurality of control ICs 810.

Figure 14:
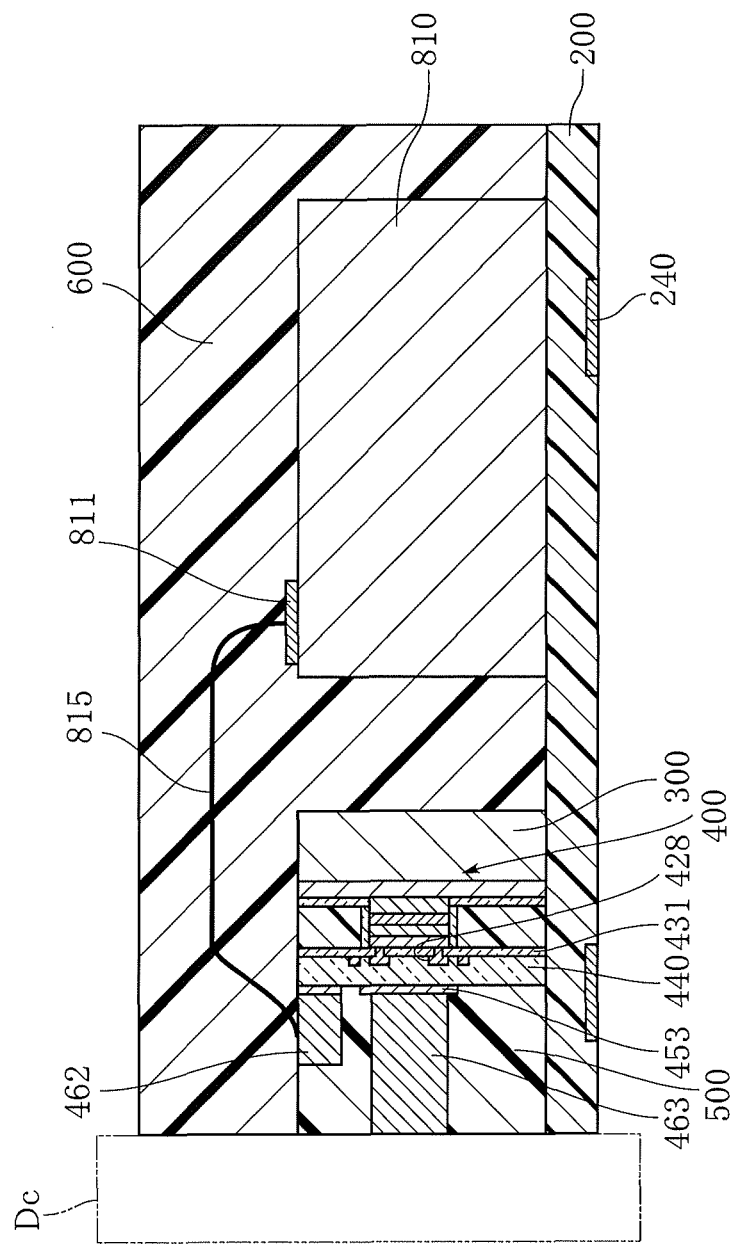
FIG. 14 is a cross-sectional view for explaining the manufacturing method of the optical communication module according to the first embodiment.

The main substrate material 201 and the second resin intermediate 601 are then cut into a plurality of pieces, such that each of the pieces includes at least one each of the intermediate products and the control ICs. When performing the cutting as above, a part of the first resin intermediate 501 and a part of the cover pillar 463 are collectively cut away, for example with a dicer Dc as shown in FIG. 14, so as to expose a part of the cover pillar 463. In this embodiment, the main substrate material 201 and the second resin intermediate 601 are also collectively cut away, together with the first resin intermediate 501 and the cover pillar 463. As a result, a main substrate 200, a first resin member 500, and a second resin member 600 are obtained.

Figure 15:
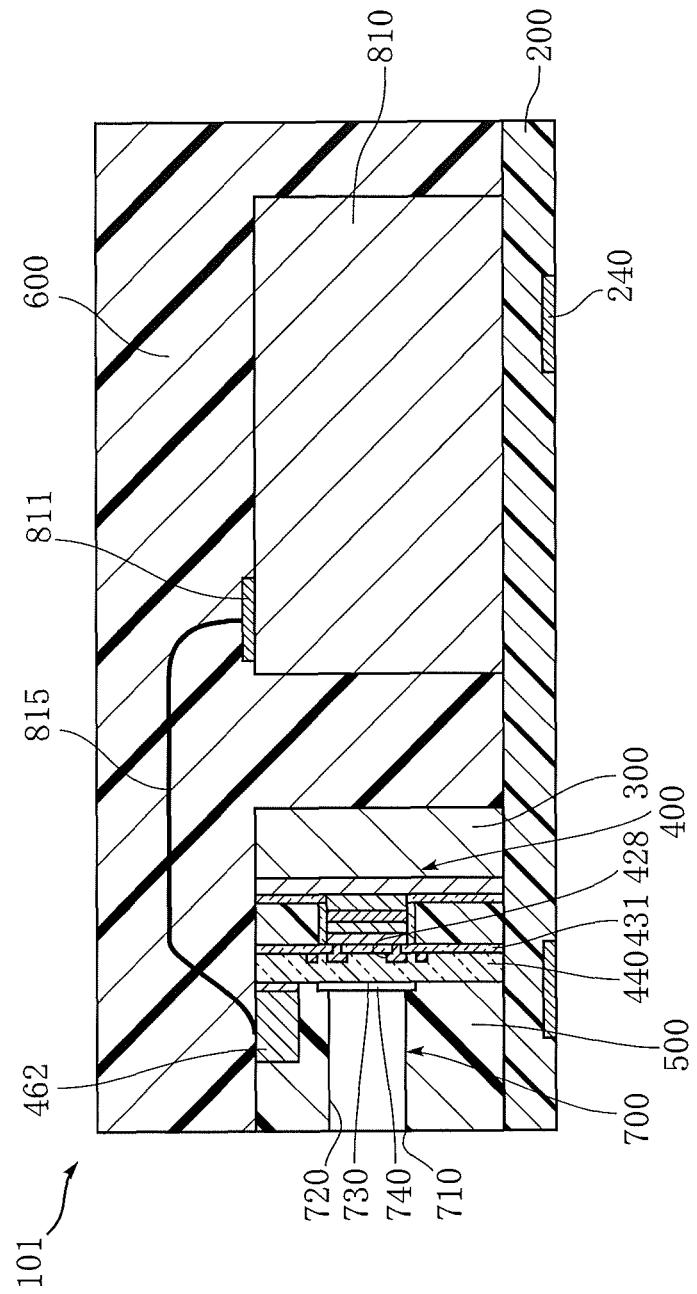
FIG. 15 is a cross-sectional view showing the optical communication module according to the first embodiment.

Then the cover pillar 463 is removed. Such removal is performed by using a selective solvent that dissolves the cover pillar 463, but not the materials constituting the main substrate 200, the first resin member 500, and the second resin member 600. Here, in the case where the cover pillar 463 is formed of Cu, it is preferable to plate the electrodes 240 of the main substrate 200 with Au. Through the removal process the cover pillar 463 is removed and an optical communication module 101 shown in FIG. 15 is obtained.

As is apparent from the aforementioned manufacturing method, the optical communication module 101 includes a main substrate 200, a secondary substrate 300, an optical semiconductor element 400, a first resin member 500, a second resin member 600, a fixing hole 700, and a control IC 810.

The fixing hole 700 is formed by removing the cover pillar 463 having the circular column shape and the cover portion 453 having the circular shape in a plan view, and includes an opening 710, an inner cylindrical portion 720, a bottom face 730, and an enlarged portion 740. The opening 710 is formed in the outer surface of the first resin member 500, and has a circular shape in this embodiment. The surface of the first resin member 500 where the opening 710 is located is flush with the end face of the main substrate 200 and the end face of the second resin member 600. The inner cylindrical portion 720 is formed in a shape corresponding to the outer surface of the cover pillar 463 of the circular column shape, and constituted of the first resin member 500. In this embodiment, the diameter of the inner cylindrical portion 720 is constant along the length of the portion. The bottom face 730, having a circular shape, is provided by a part of the second dielectric transmission layer 440. The enlarged portion 740 is formed by removing the cover portion 453, and an example of the "discontinuous portion" in the present invention. The enlarged portion 740 is disposed between the inner cylindrical portion 720 and the bottom face 730. The cover portion 453 is slightly larger in cross-sectional size than the cover pillar 463, causing the enlarged portion 740 to be "discretely connected" to the inner cylindrical portion 720. The enlarged portion 740 is larger in cross-sectional size than the inner cylindrical portion 720. In this embodiment, the axial length of the inner cylindrical portion 720 is larger than that of the enlarged portion 740. For example, the fixing hole 700 may have a diameter of approximately 100 μm to 200 μm, and an axial length of approximately 100 μm to 200 μm.

When viewed in the axial direction of the fixing hole 700, the opening 710, the bottom face 730, and the optical semiconductor element 400 overlap each other. Therefore, light emitted from the optical functional region of the optical semiconductor element 400 or proceeding toward the optical functional region passes through the fixing hole 700. The axial direction of the fixing hole 700 is parallel to the obverse surface of the main substrate 200 and perpendicular to the secondary substrate 300. The secondary substrate 300 is oriented upright on the obverse surface of the main substrate 200. Thus, the optical communication module 101 is configured as a side-view type module that outputs light in a direction parallel to the mounting surface that is provided with the electrodes 240.

The fixing hole 700 is a space into which an optical fiber is inserted for transmitting light emitted from the optical functional region of the optical semiconductor element 400 or light proceeding toward the optical functional region from the outside. The optical fiber is fixed in the fixing hole 700 in a manner such that the end face of the fiber confronts the bottom face 730. Various fixing methods may be adopted, for example clamping or bonding the optical fiber at one or more places.

The advantages of the optical communication module 101 and the manufacturing method thereof will be described below.

In the illustrated embodiment, the optical fiber is fixed by means of the fixing hole 700. The first resin member 500 providing the fixing hole 700 is stacked on the optical semiconductor element 400 in the vicinity of the second dielectric transmission layer 440 and the redistribution layer 450. Accordingly, there is no need to additionally provide a mechanism exclusive for positioning and fixing the optical fiber at a position distant from the optical semiconductor element 400. With the mentioned configuration, the optical communication module 101 can be manufactured with higher efficiency and accuracy, and also in a smaller size.

The redistribution layer 450 can be formed accurately with respect to the active layer 423 or the core of the optical functional region of the optical semiconductor element 400. The cover pillar 463, which is formed by plating, is automatically formed so as to accurately overlap the cover portion 453 of the redistribution layer 450. Accordingly, the fixing hole 700, formed upon removing the cover pillar 463, is to be located accurately with respect to the active layer 423 or the core of the optical functional region, thereby enabling the accurate positioning of the optical fiber.

In the illustrated embodiment, a number of steps for manufacturing the optical communication module 101 can be performed collectively with respect to a plurality of optical semiconductor elements 400 provided on the secondary substrate material 301 and the main substrate material 201. Such a method provides a production efficiency equivalent to the case of performing so-called wafer-level process in the known semiconductor process.

Removing the cover portion 453 of the redistribution layer 450 together with the cover pillar 463 allows the fixing hole 700 to be accurately formed at the desired position, while also properly exposing the second dielectric transmission layer 440 so as to provide the bottom face 730 of the fixing hole 700. Such a configuration is advantageous to preventing undesired attenuation of the light emitted from the active layer 423.

Referring to FIG. 5, the n-type electrode pillar 461, the p-type electrode pillar 462, and the cover pillar 463 are formed smaller, as viewed in plan, than the n-type redistribution internal electrode 451, the p-type redistribution internal electrode 452, and the cover portion 453 of the redistribution layer 450, respectively. Thus, the n-type electrode pillar 461, the p-type electrode pillar 462, and the cover pillar 463 do not protrude from the n-type redistribution internal electrode 451, the p-type redistribution internal electrode 452, and the cover portion 453 of the redistribution layer 450, respectively.

Referring to FIG. 6, the n-type electrode pillar 461 and the p-type electrode pillar 462 are formed lower than the cover pillar 463. This allows the cover pillar 463 alone to be properly exposed from the first resin member 500 by the cutting shown in FIG. 14. Thus, in the removing process shown in FIG. 15, the cover pillar 463 and the cover portion 453 alone are to be removed.

By the cutting shown in FIG. 9, the n-type electrode pillar 461 and the p-type electrode pillar 462 are exposed in a direction perpendicular to the height direction of the cover pillar 463, as shown in FIG. 11. Such an arrangement is advantageous for manufacturing the optical communication module 101 of the side-view type, since the mounting of the intermediate product can be performed in the orientation shown in FIG. 12.

Figure 16:
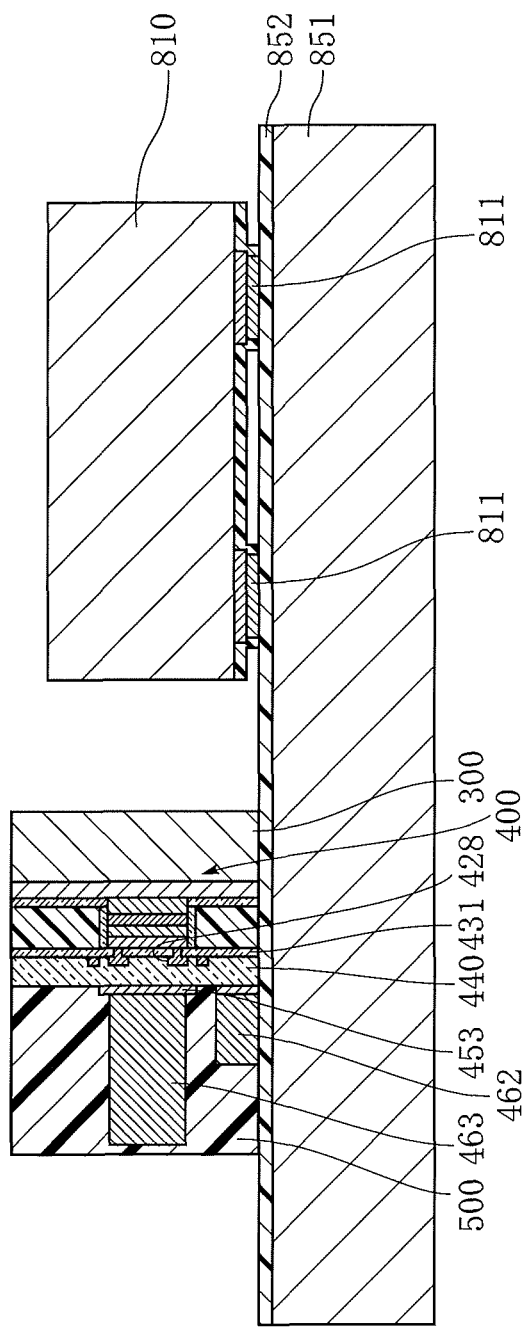
FIG. 16 is a cross-sectional view of principal parts for explaining a manufacturing method of an optical communication module according to a second embodiment of the present invention.

FIGS. 16 to 38 illustrate a manufacturing method of an optical communication module according to a second embodiment of the present invention. First, a plurality of intermediate products shown in FIGS. 10 and 11 are prepared. Then, as shown in FIG. 16, a plurality of sets of the intermediate products and the control ICs 810 are bonded to a support substrate 851. To this end, a bonding layer 852 is provided on the support substrate 851. In the illustrated embodiment, one intermediate product and one corresponding control IC 810 are located adjacent to each other. In the drawings that follow, only one set of the intermediate product and the adjacent control IC 810 is shown. In the bonding process, the intermediate product is bonded to the bonding layer 852 via the exposed surfaces of the n-type electrode pillar 461 and the p-type electrode pillar 462. Likewise, the control IC 810 is bonded to the bonding layer 852 via the electrodes 811.

Figure 17:
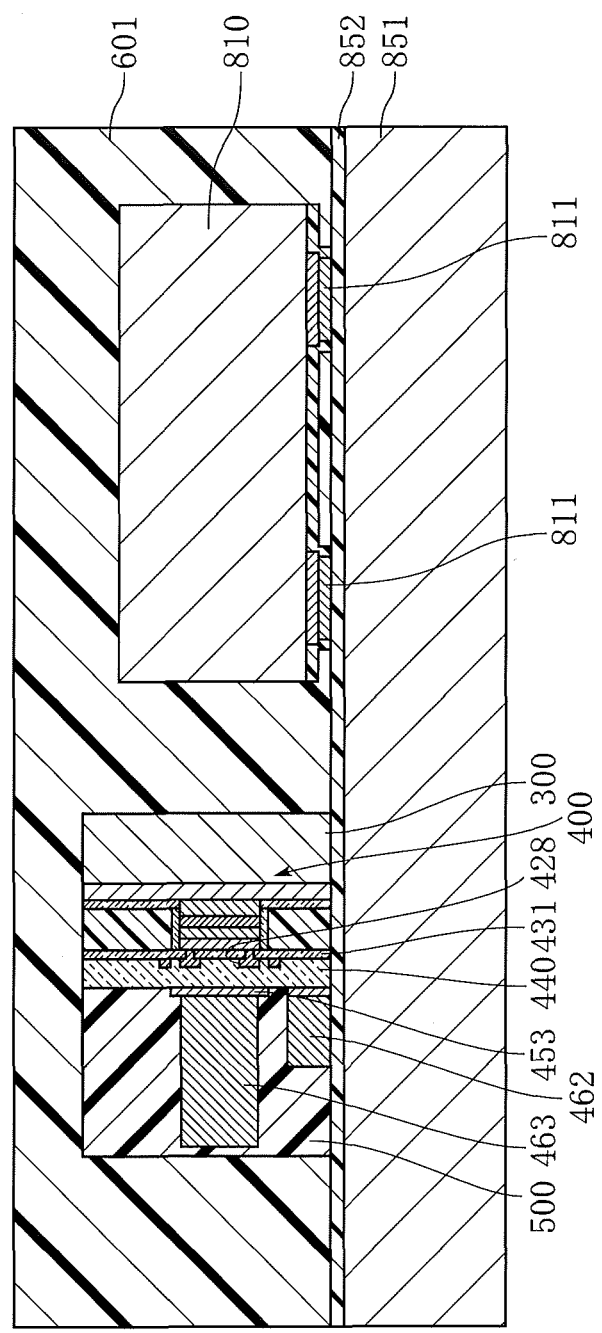
FIG. 17 is a cross-sectional view of principal parts for explaining the manufacturing method of the optical communication module according to the second embodiment.
Figure 18:
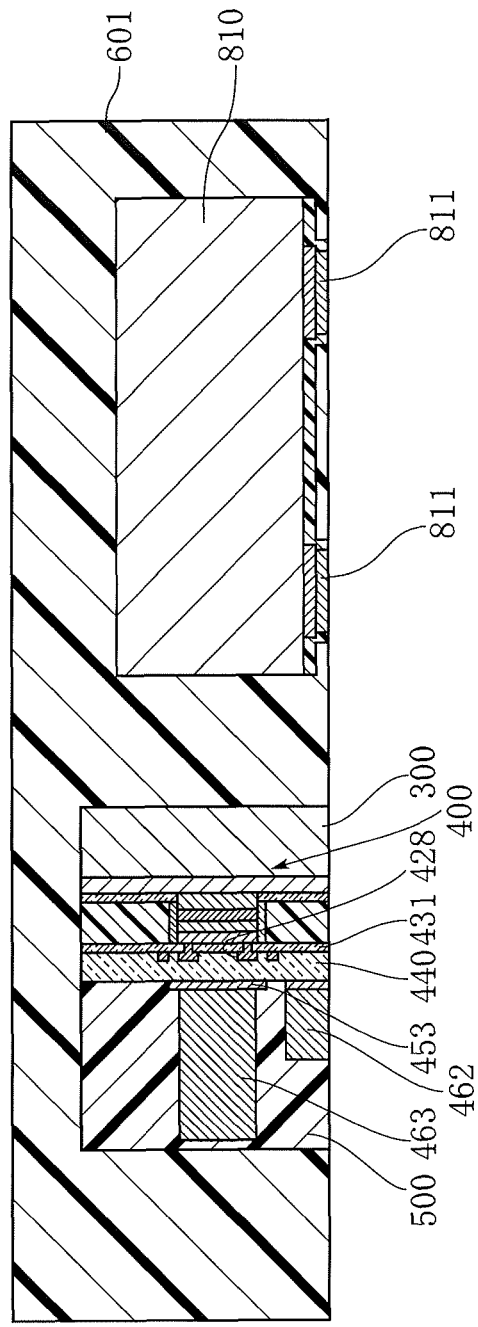
FIG. 18 is another cross-sectional view of principal parts for explaining the manufacturing method of the optical communication module according to the second embodiment.

As shown in FIG. 17, the second resin intermediate 601 is formed so as to collectively cover the plurality of intermediate products and the plurality of control ICs 810. Then the support substrate 851 and the bonding layer 852 are removed as shown in FIG. 18.

Figure 19:
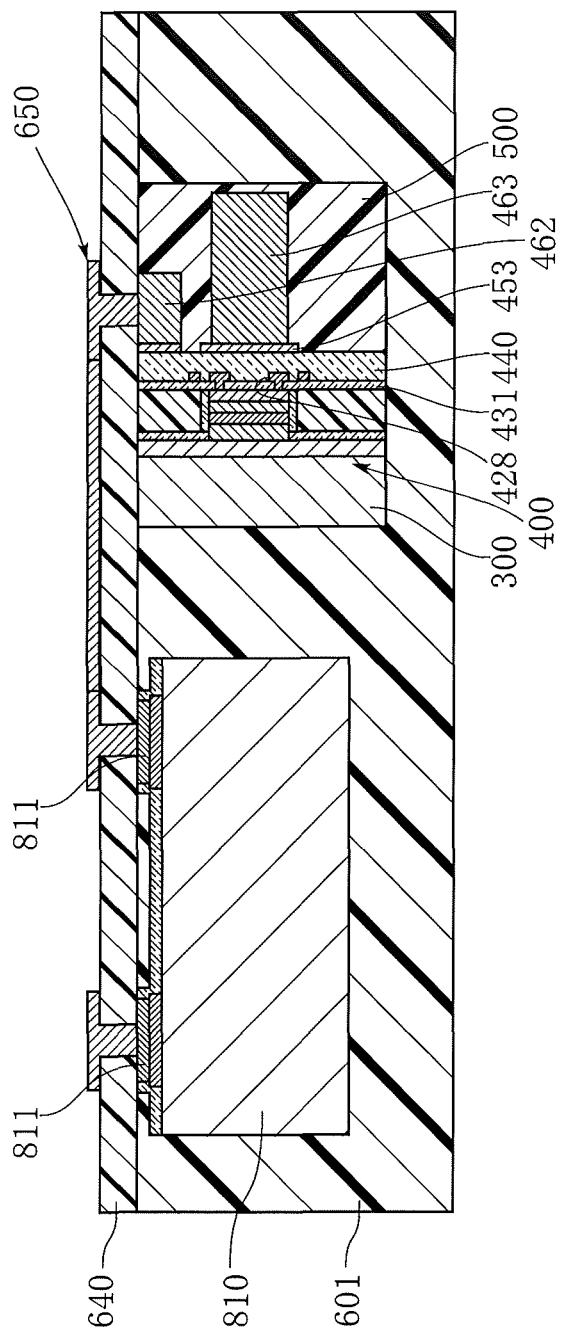
FIG. 19 is a cross-sectional view of principal parts for explaining the manufacturing method of the optical communication module according to the second embodiment.

As shown in FIG. 19, a dielectric layer 640 and a redistribution layer 650 are formed. The redistribution layer 650 corresponds to the "additional redistribution layer" of the present invention. The redistribution layer 650 is electrically connected to the n-type electrode pillar 461 and the p-type electrode pillar 462 of the intermediate product, as well as to the electrodes 811 of the control IC 800.

Figure 20:
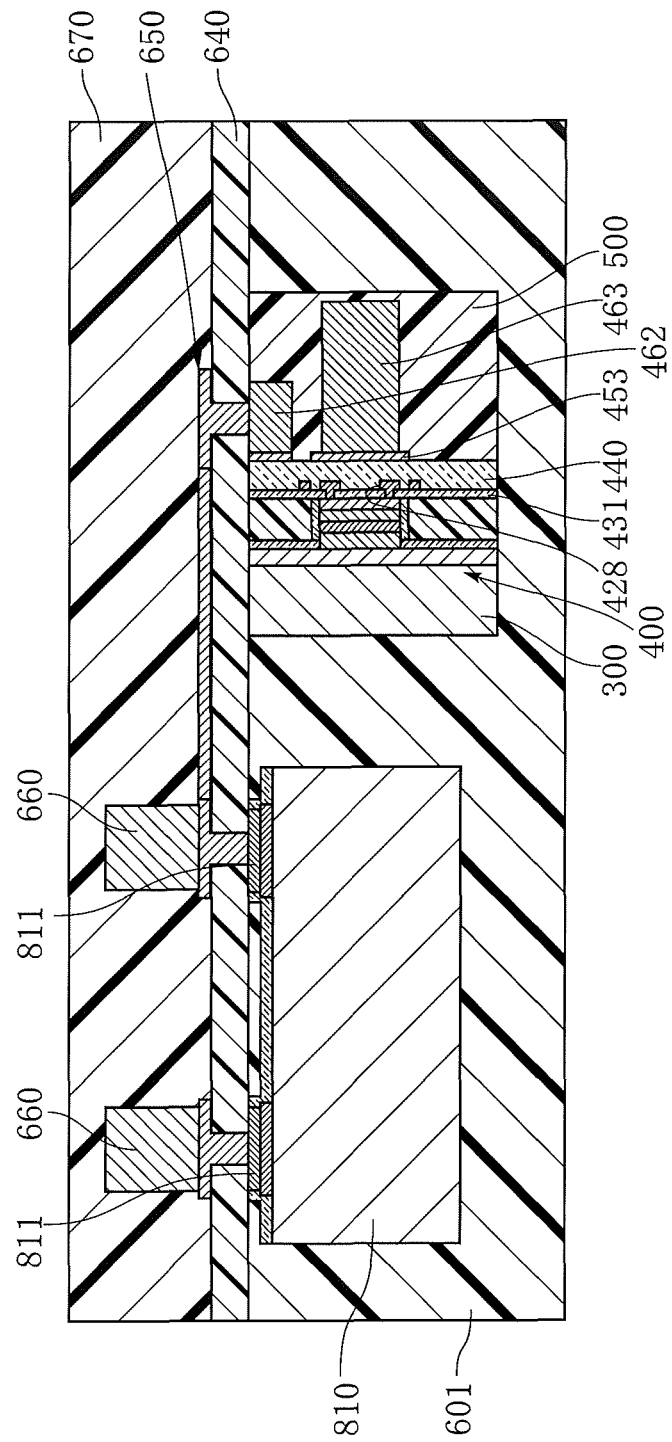
FIG. 20 is a cross-sectional view of principal parts for explaining the manufacturing method of the optical communication module according to the second embodiment.

Then, as shown in FIG. 20, external electrode pillars 660 are formed. The external electrode pillars 660 may be formed by a process similar to the forming of the n-type electrode pillar 461, the p-type electrode pillar 462, and the cover pillar 463. Then a third resin member 670 is formed so as to cover the external electrode pillars 660. The third resin member 670 is, for example, formed of an epoxy resin.

Figure 21:
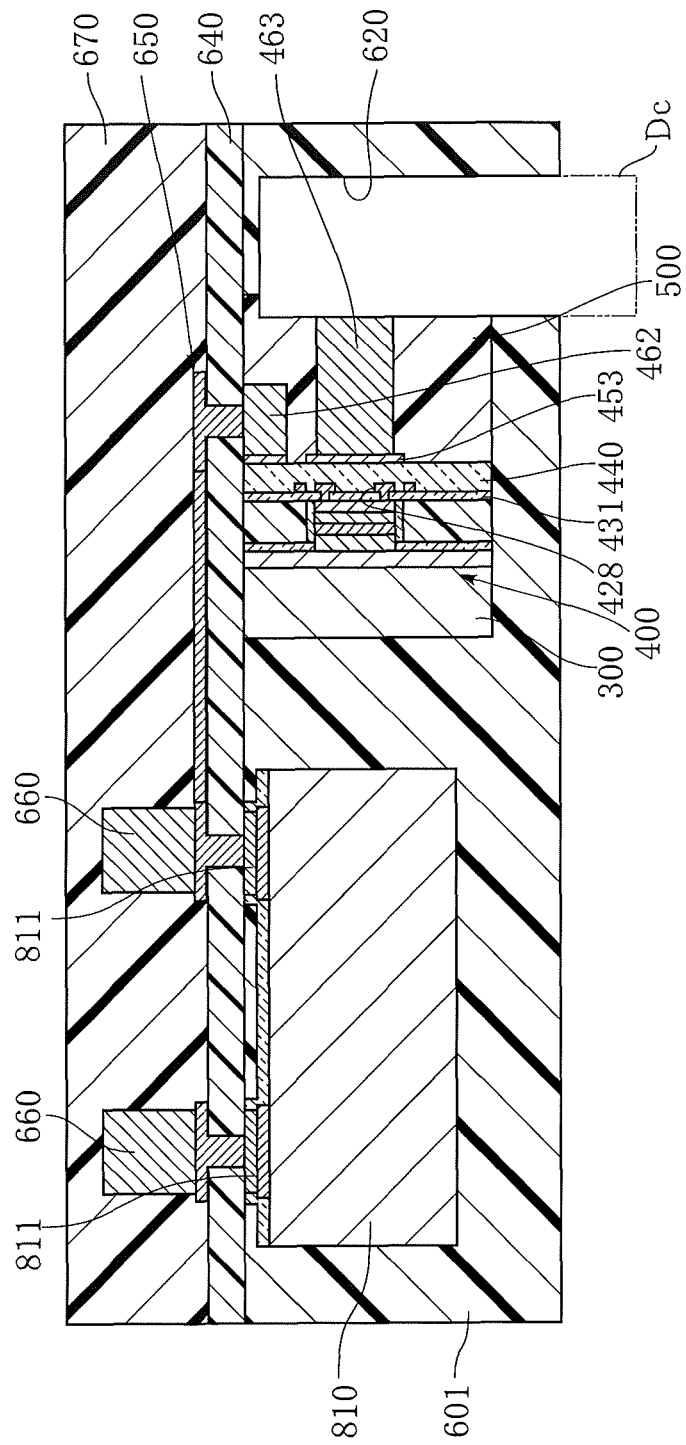
FIG. 21 is a cross-sectional view of principal parts for explaining the manufacturing method of the optical communication module according to the second embodiment.

As shown in FIG. 21, a part of each of the second resin intermediate 601, the first resin intermediate 501, and the cover pillar 463 is collectively cut away by a dicer Dc, for example. This cutting produces a groove 620 in which the cover pillar 463 is exposed.

Figure 22:
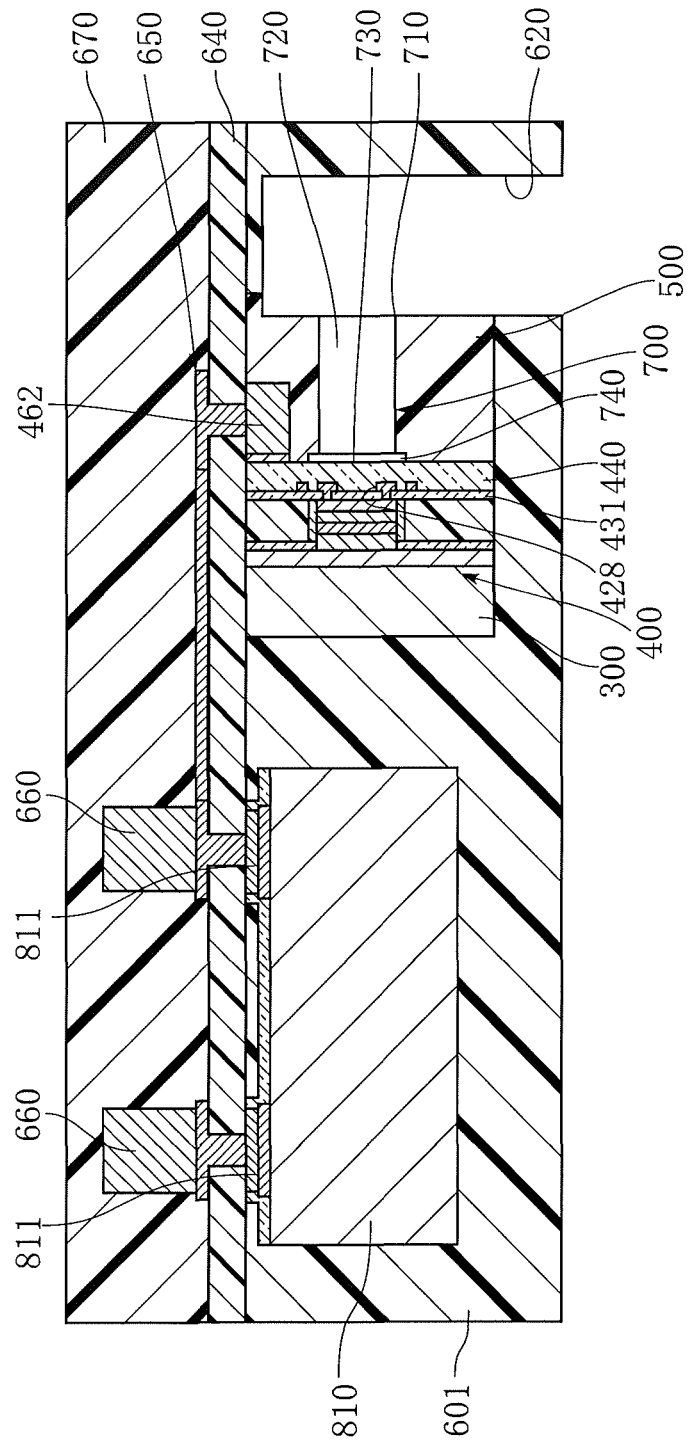
FIG. 22 is a cross-sectional view of principal parts for explaining the manufacturing method of the optical communication module according to the second embodiment.

As shown in FIG. 22, the cover pillar 463 and the cover portion 453 are selectively removed by etching. As a result, the fixing hole 700 is obtained.

Figure 23:
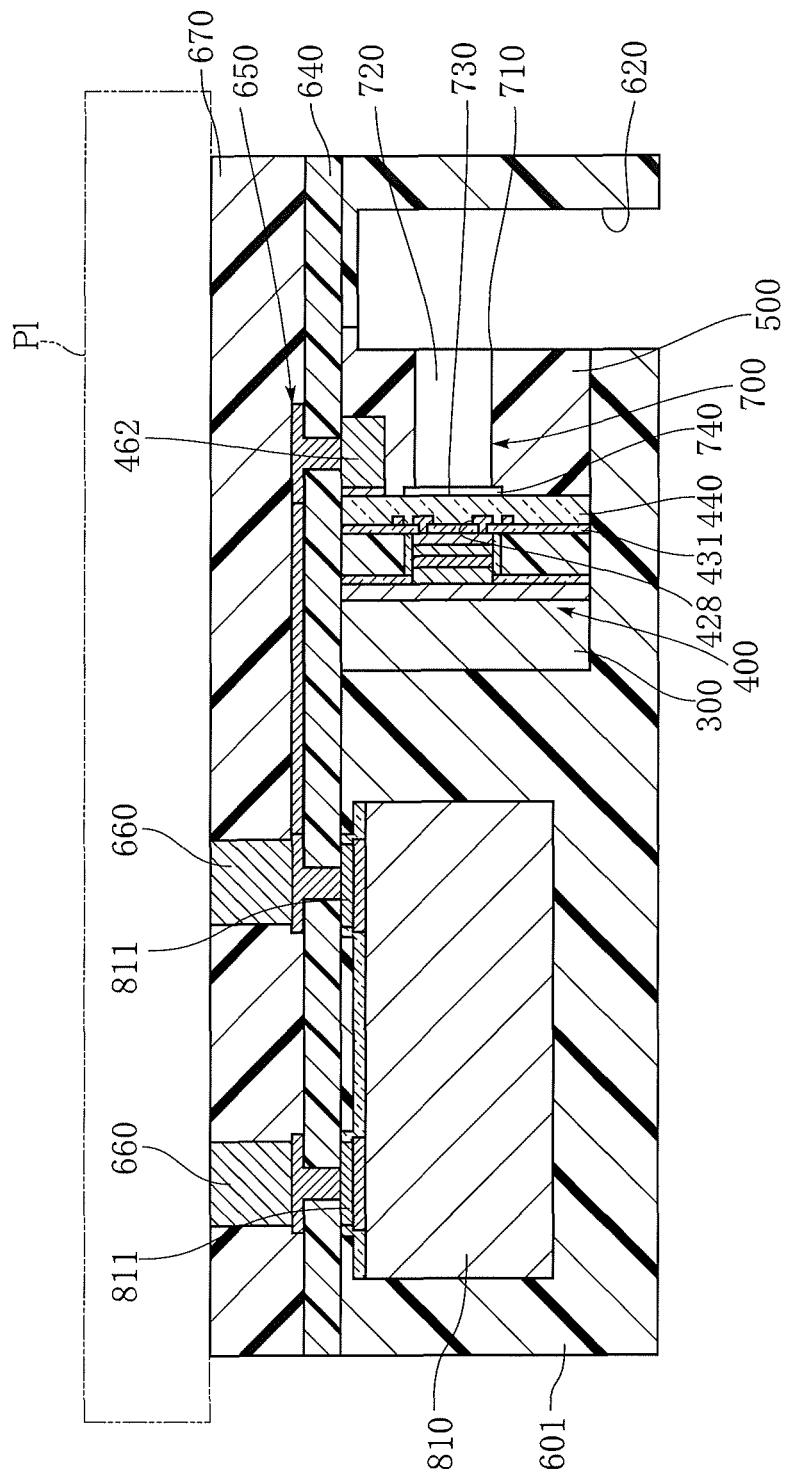
FIG. 23 is a cross-sectional view of principal parts for explaining the manufacturing method of the optical communication module according to the second embodiment.
Figure 24:
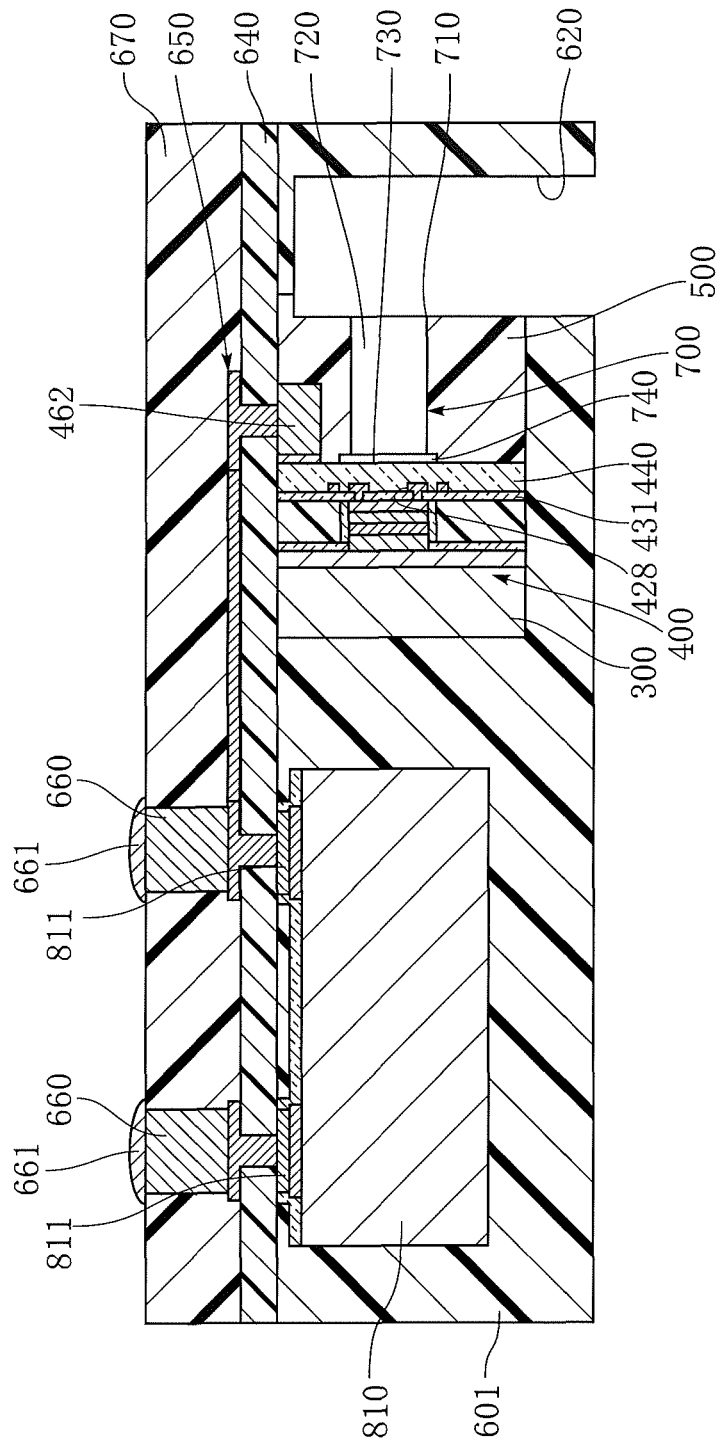
FIG. 24 is a cross-sectional view of principal parts for explaining the manufacturing method of the optical communication module according to the second embodiment.

As shown in FIG. 23, the third resin member 670 is polished, for example with a polisher Pl, so as to expose the external electrode pillar 660 from the third resin member 670. Then an external electrode 661 is formed on each of the external electrode pillars 660, for example by plating, as shown in FIG. 24.

Figure 25:
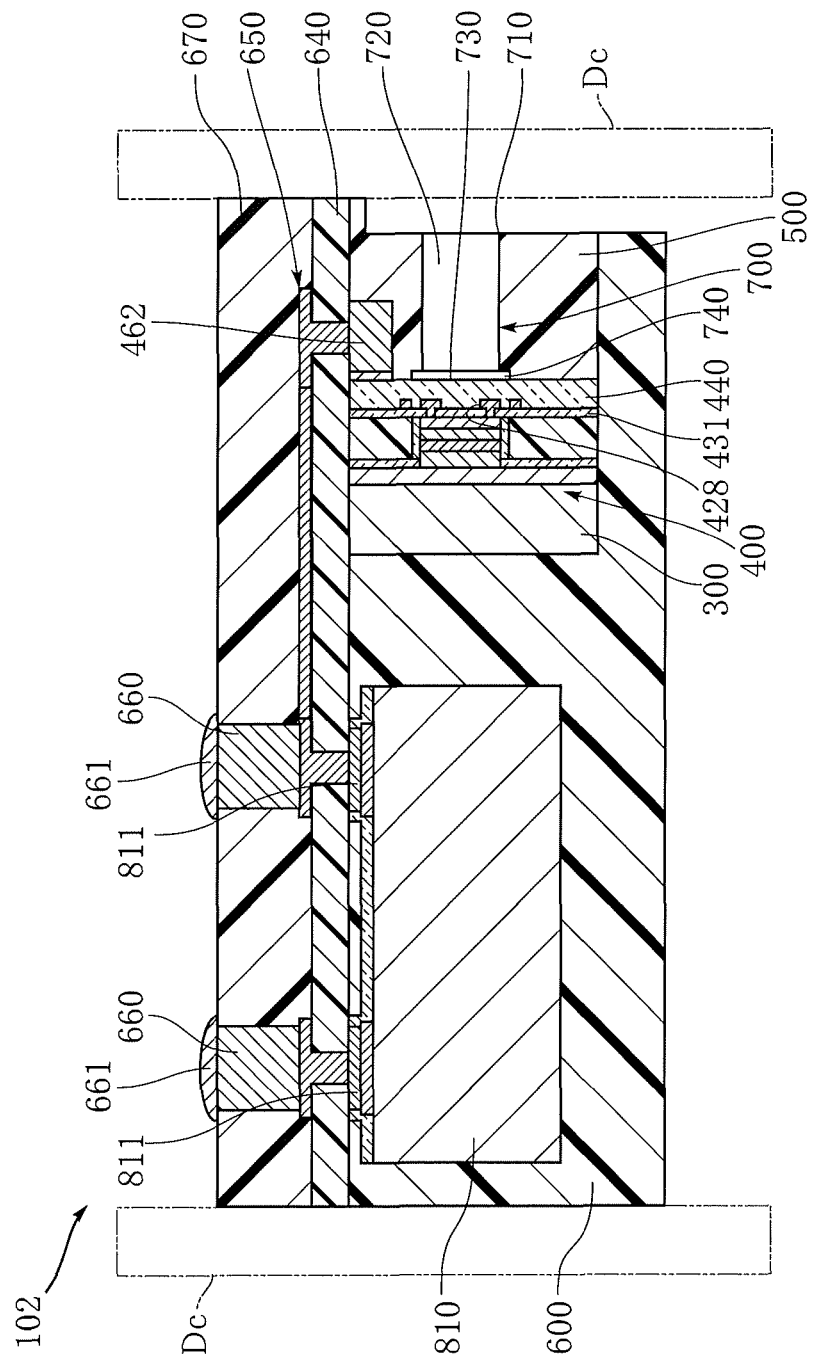
FIG. 25 is a cross-sectional view showing the optical communication module according to the second embodiment.

As shown in FIG. 25, the second resin intermediate 601 and the third resin member 670 are collectively cut, for example by the dicer Dc, into a plurality of pieces such that each of the pieces includes at least one intermediate product and one control IC 810. Thus, an optical communication module 102 is obtained.

The method according to the above-noted embodiment also allows the optical communication module 102 to be manufactured with higher efficiency and in a smaller size. In addition, providing the redistribution layer 650 allows the external electrodes 661 to be formed at desired positions, irrespective of the locations of the optical semiconductor element 400 and the control IC 810.

In the illustrated embodiment, the second resin intermediate 601 is cut with the dicer Dc not over the entire thickness thereof but to halfway in the thickness direction, as shown in FIG. 21. Accordingly, although a part of the cover pillar 463 and a part of the first resin intermediate 501 are collectively cut and removed, the dielectric layer 640 and the third resin member 670 remain uncut. Therefore, the etching process corresponding to FIG. 22, the polishing process corresponding to FIG. 23, and the plating process corresponding to FIG. 24 can be collectively performed with respect to the plurality of optical semiconductor elements 400. Such an arrangement is advantageous to improving production efficiency. Here, the method of removing a portion up to halfway in the thickness direction can also be applied to the manufacturing process of the optical communication module 101.

Figure 26:
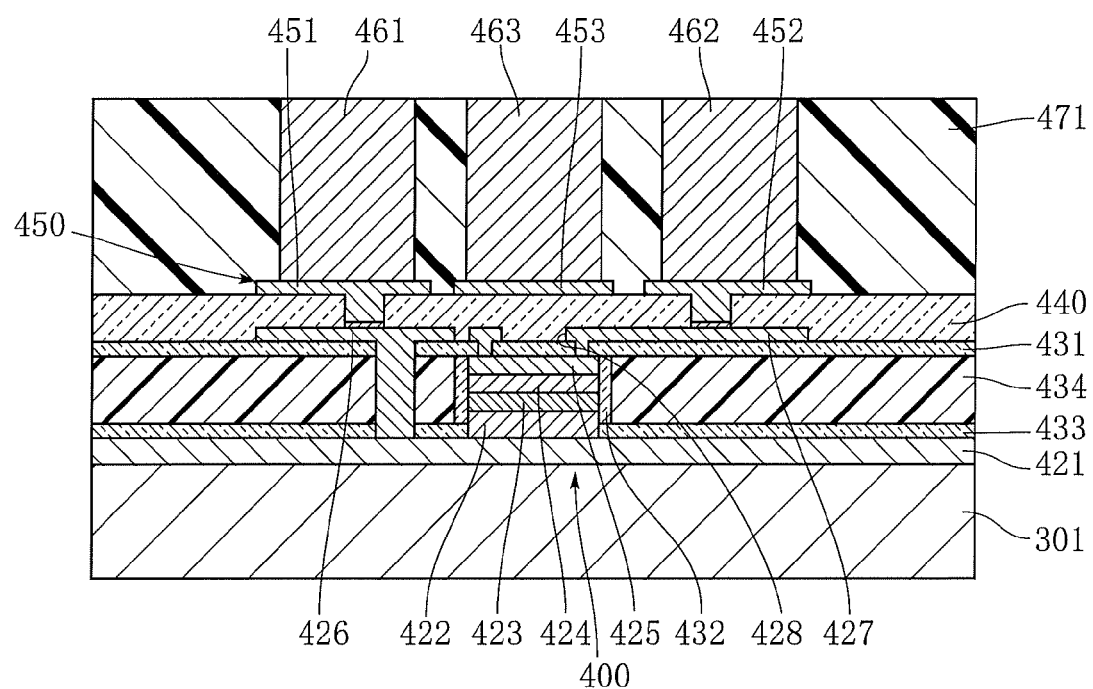
FIG. 26 is a cross-sectional view of principal parts for explaining a manufacturing method of an optical communication module according to a third embodiment of the present invention.

FIGS. 26 to 35 illustrate a manufacturing method of an optical communication module according to a third embodiment of the present invention. First, the optical semiconductor element 400, the second dielectric transmission layer 440, the redistribution layer 450, the resist layer 471, the n-type electrode pillar 461, the p-type electrode pillar 462, and the cover pillar 463 shown in FIG. 26 are formed on the secondary substrate material 301, through the process shown in FIGS. 1 to 5. In this embodiment, the n-type electrode pillar 461, the p-type electrode pillar 462, and the cover pillar 463 may be formed slightly lower than those shown in FIG. 5. A plurality of optical semiconductor elements 400 are formed on one secondary substrate material 301. Although the subsequent description is focused on one of the optical semiconductor elements 400, it is preferable that the steps described below are collectively performed with respect to all the optical semiconductor elements 400.

Figure 28:
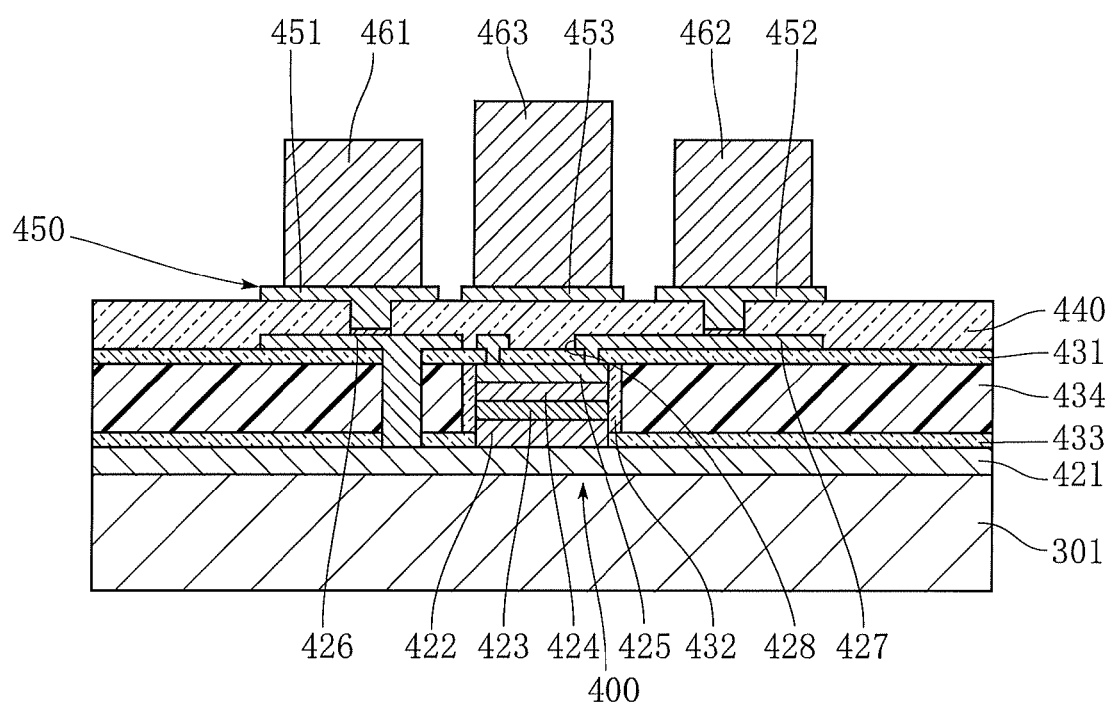
FIG. 28 is another cross-sectional view of principal parts for explaining the manufacturing method of the optical communication module according to the third embodiment.

Then, the resist layer 472 is formed, and the n-type electrode pillar 461 and the p-type electrode pillar 462 are selectively and partially removed by etching, for example. The amount to be removed in this case may be smaller than the amount described above referring to FIG. 6. The resist layers 471 and 472 are then removed, as shown in FIG. 28.

Figure 29:
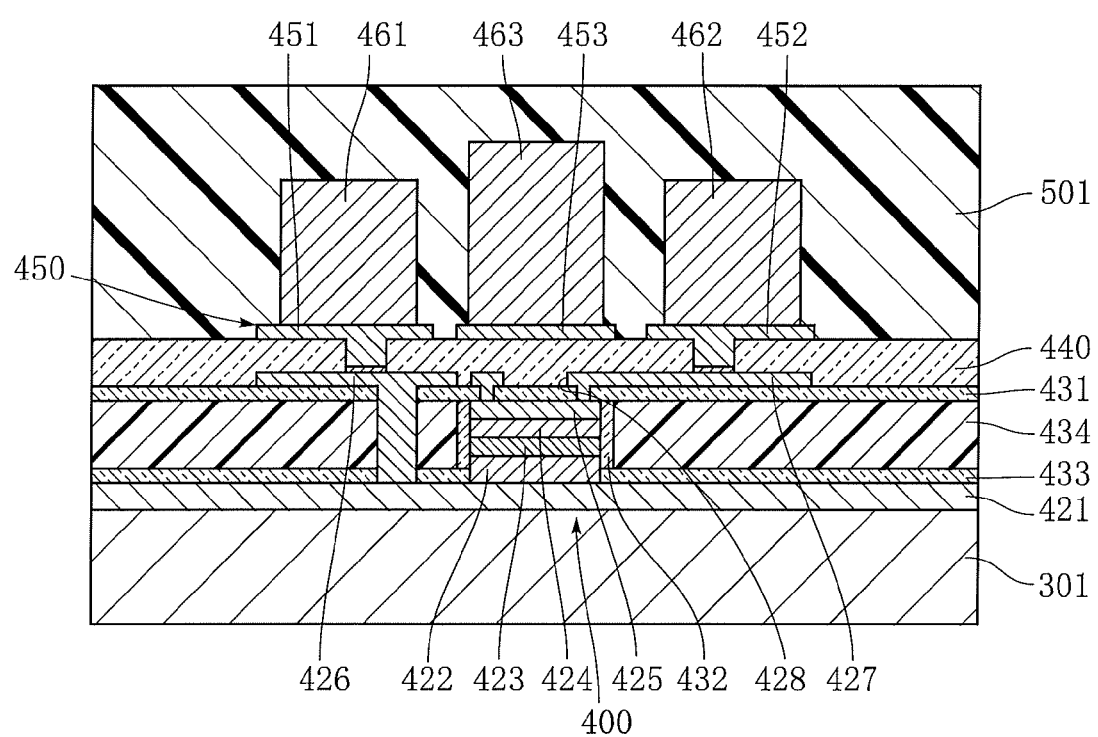
FIG. 29 is a cross-sectional view of principal parts for explaining the manufacturing method of the optical communication module according to the third embodiment.
Figure 30:
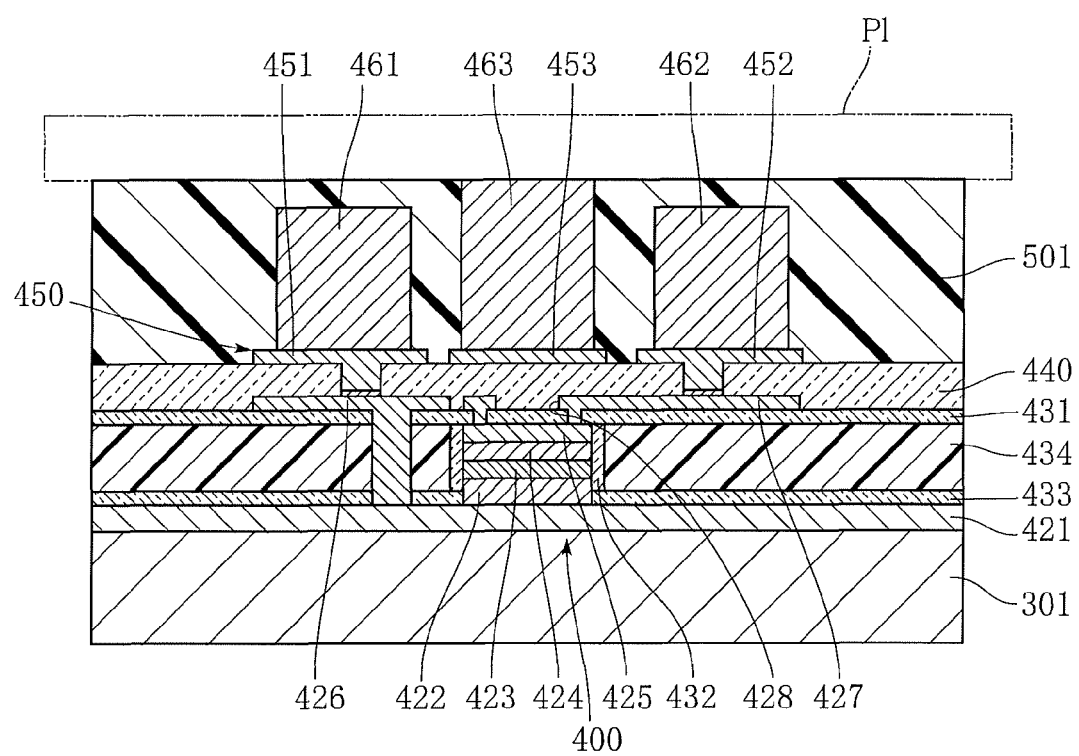
FIG. 30 is a cross-sectional view of principal parts for explaining the manufacturing method of the optical communication module according to the third embodiment.

As shown in FIG. 29, the first resin intermediate 501 is formed so as to cover the second dielectric transmission layer 440, the n-type electrode pillar 461, the p-type electrode pillar 462, and the cover pillar 463. Then, as shown in FIG. 30, the first resin intermediate 501 is polished for example with the polisher Pl, so as to expose the cover pillar 463 from the first resin intermediate 501. In this process, the n-type electrode pillar 461 and the p-type electrode pillar 462 are kept fully covered with the first resin intermediate 501.

Figure 31:
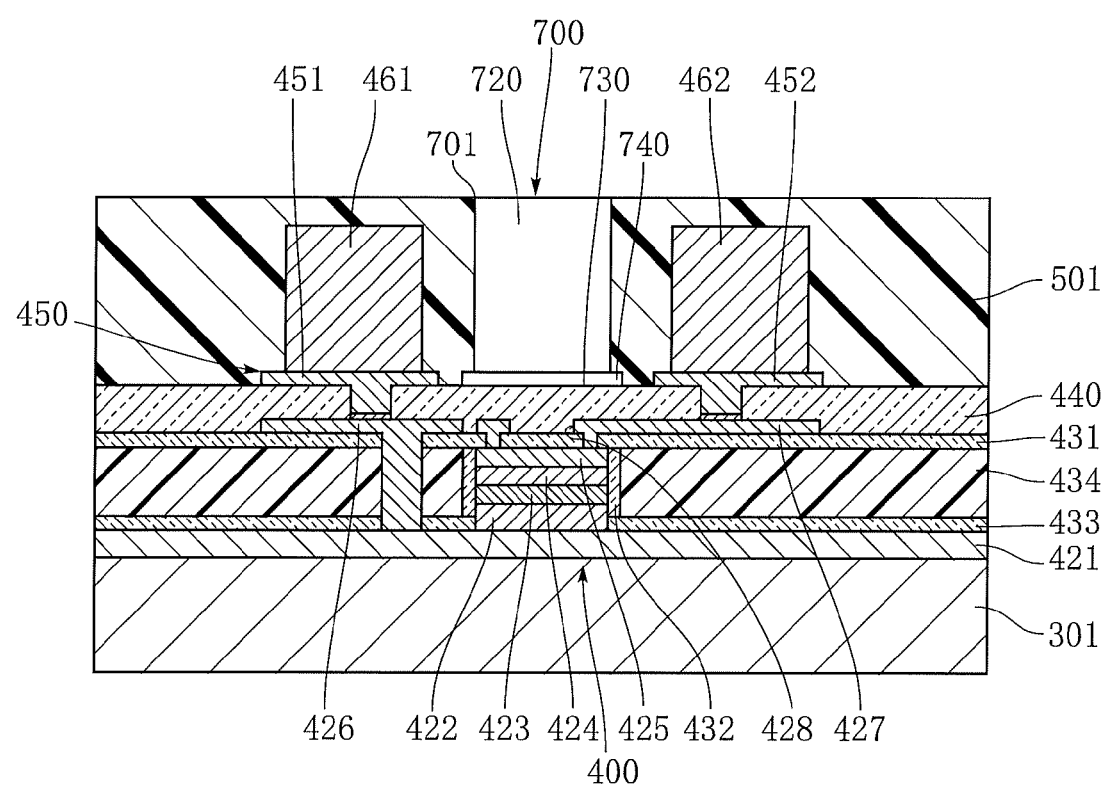
FIG. 31 is a cross-sectional view of principal parts for explaining the manufacturing method of the optical communication module according to the third embodiment.
Figure 32:
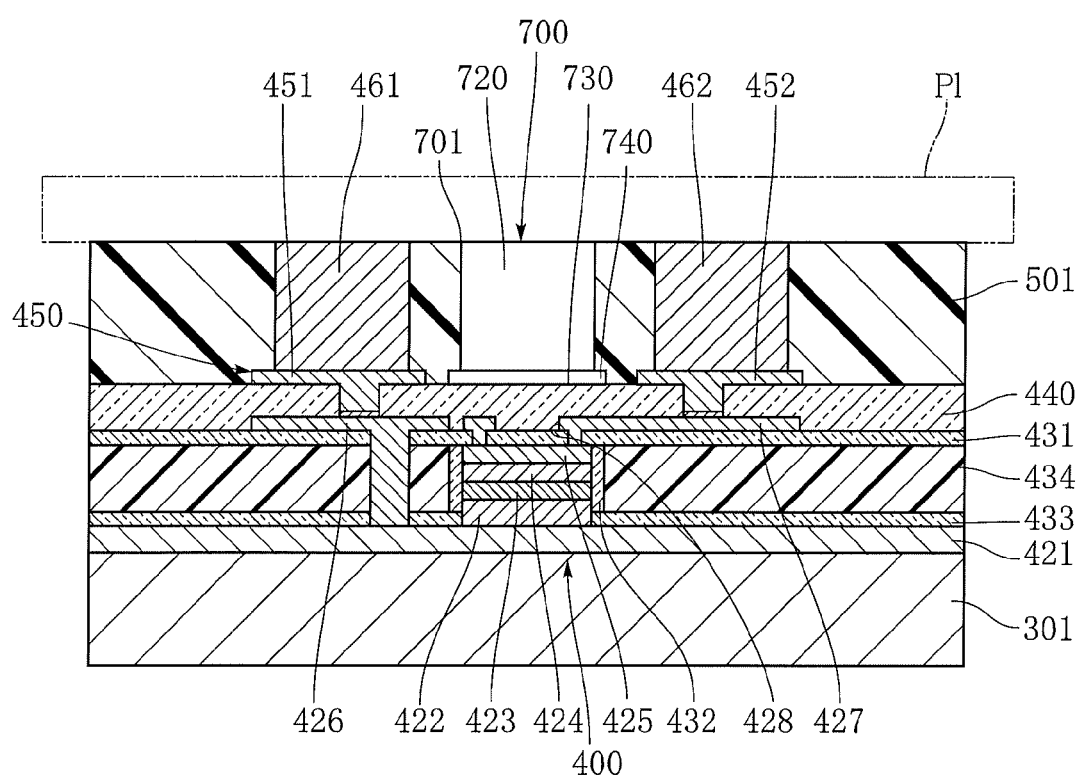
FIG. 32 is a cross-sectional view of principal parts for explaining the manufacturing method of the optical communication module according to the third embodiment.
Figure 33:
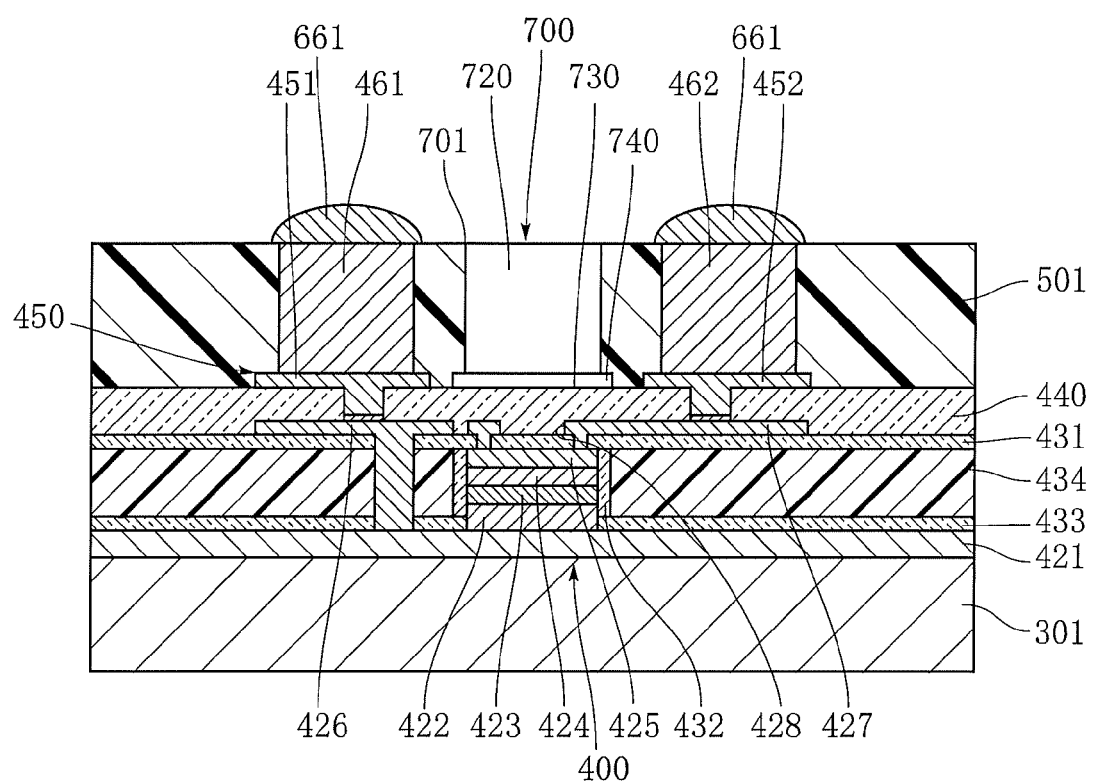
FIG. 33 is a cross-sectional view of principal parts for explaining the manufacturing method of the optical communication module according to the third embodiment.

As shown in FIG. 31, the cover pillar 463 and the cover portion 453 are selectively removed for example by etching, so as to form the fixing hole 700. Then the first resin intermediate 501 is polished for example with the polisher Pl, so as to expose the n-type electrode pillar 461 and the p-type electrode pillar 462 from the first resin intermediate 501, as shown in FIG. 32. Then, the external electrode 661 is formed on each of the n-type electrode pillar 461 and the p-type electrode pillar 462, as shown in FIG. 33, by plating for example.

Figure 34:
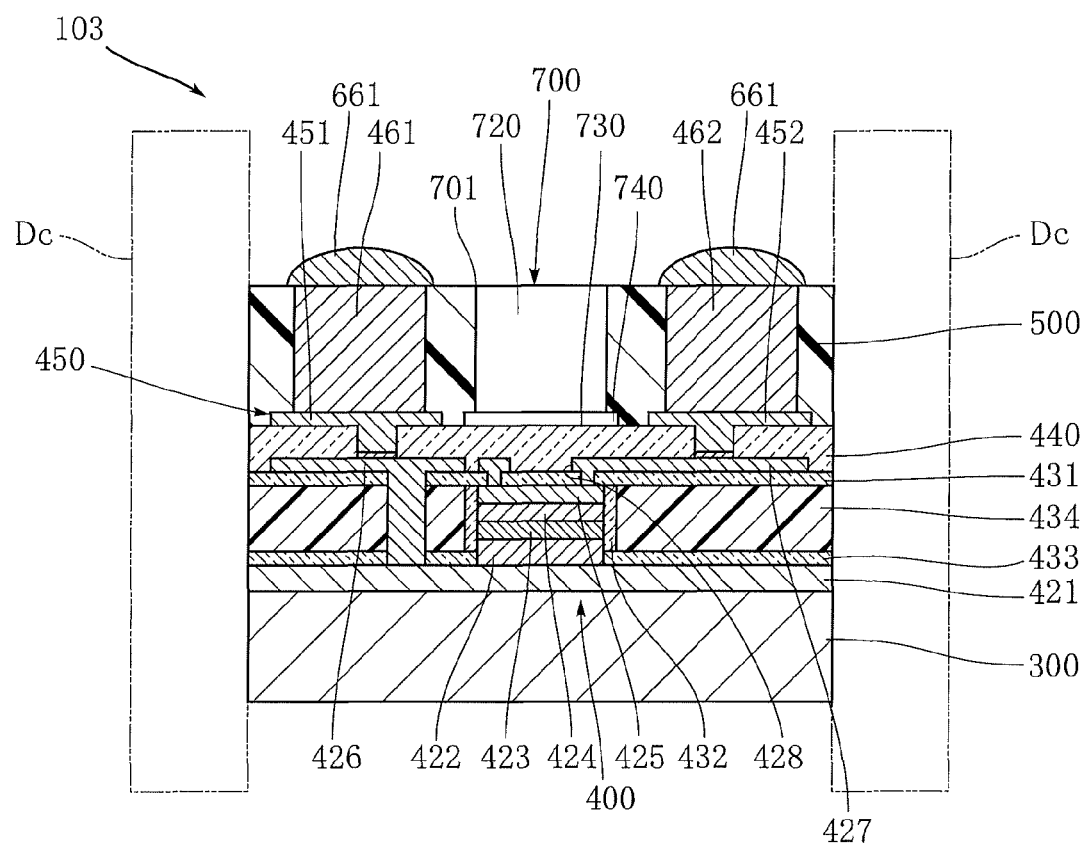
FIG. 34 is a cross-sectional view showing the optical communication module according to the third embodiment.

As shown in FIG. 34, the secondary substrate material 301 and the first resin intermediate 501 are cut into a plurality of pieces, for example with the dicer Dc, such that each piece includes at least one optical semiconductor element 400. Thus, an optical communication module 103 is obtained.

Figure 35:
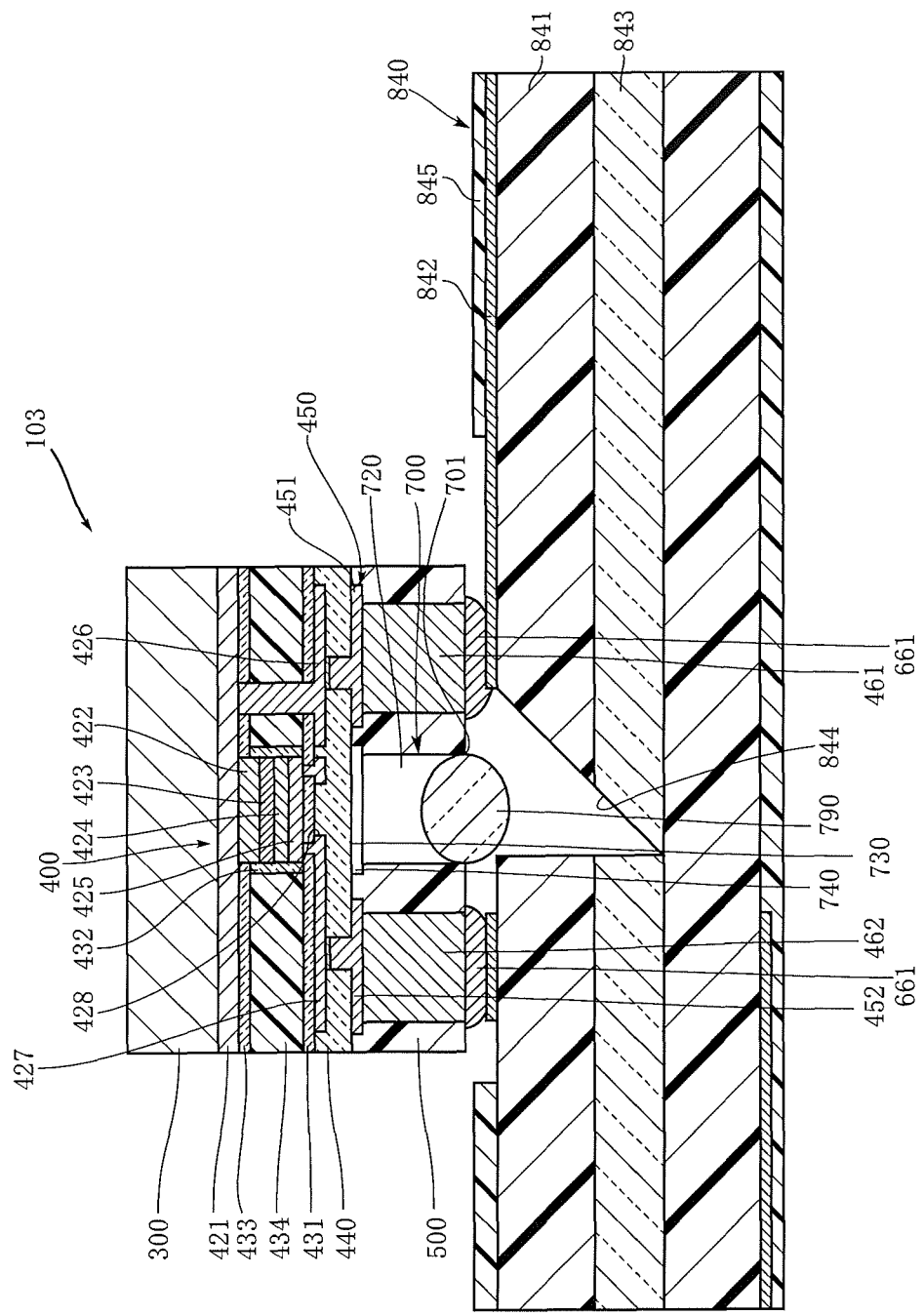
FIG. 35 is a cross-sectional view showing an application example of the optical communication module according to the third embodiment.

FIG. 35 illustrates an example of how the optical communication module 103 is used. In this example, the optical communication module 103 is mounted on an optical interconnect substrate 840. The optical interconnect substrate 840 includes a base member 841, a wiring layer 842, an optical waveguide 843 and a cover layer 845, and constitutes a transmission path for electrical and optical transmission of information.

The base member 841 is, for example, formed of a nontransparent insulating material. The wiring layer 842 is provided on the base member 841, and formed of a metal such as Cu. The external electrodes 661 of the optical communication module 103 are respectively connected to predetermined portions of the wiring layer 842. The cover layer 845 serves to protect the wiring layer 842.

The optical waveguide 843 is formed of, for example, a transparent resin or glass, and serves as a path for transmitting the light emitted from the optical communication module 103. The optical waveguide 843 includes an entrance surface 844. The entrance surface 844 is obtained by forming a groove having a wedge-shaped cross-section on the optical interconnect substrate 840. The optical communication module 103 is mounted with the fixing hole 700 facing to the entrance surface 844. In addition, in the illustrated example, the optical communication module 103 is provided with a lens 790. The lens 790 is attached at or near the opening 710 of the fixing hole 700. The light emitted from the active layer 423 passes through the fixing hole 700 and is converged on the entrance surface 844 by the lens 790. Through the entrance surface 844, the converged light enters the optical waveguide 843 and proceeds along the waveguide 843. Thus, the optical communication module 103 is configured as a bottom-view type module that outputs light toward the mounting surface on which side the external electrodes 661 are provided.

The method according to the above-noted embodiment also allows the optical communication module 103 to be manufactured with higher efficiency, and in a smaller size. When the optical communication module 103 of the bottom-view type is mounted on a substrate such as the optical interconnect substrate 840, a laser beam can be emitted in the thickness direction of the optical interconnect substrate 840, as shown in FIG. 35. Alternatively, an optical fiber may be fixed in the fixing hole 700.

Figure 27:
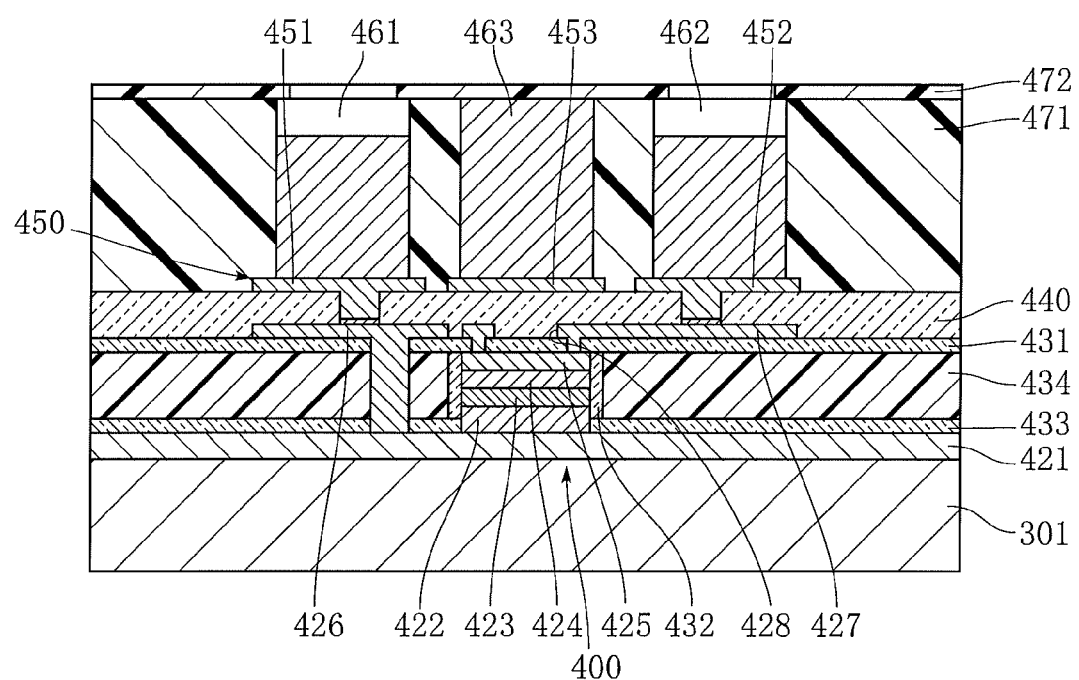
FIG. 27 is a cross-sectional view of principal parts for explaining the manufacturing method of the optical communication module according to the third embodiment.

In the illustrated embodiment, as shown in FIG. 27, the n-type electrode pillar 461 and the p-type electrode pillar 462 are formed selectively lower, thereby enabling exposure of the cover pillar 463 alone in the polishing process shown in FIG. 30. Accordingly, the cover pillar 463 and the cover portion 453 alone can be selectively removed, as shown in FIG. 31. Further, by performing the polishing process shown in FIG. 32, the n-type electrode pillar 461 and the p-type electrode pillar 462 are selectively exposed, and the external electrodes 661 shown in FIG. 33 are properly formed.

Figure 36:
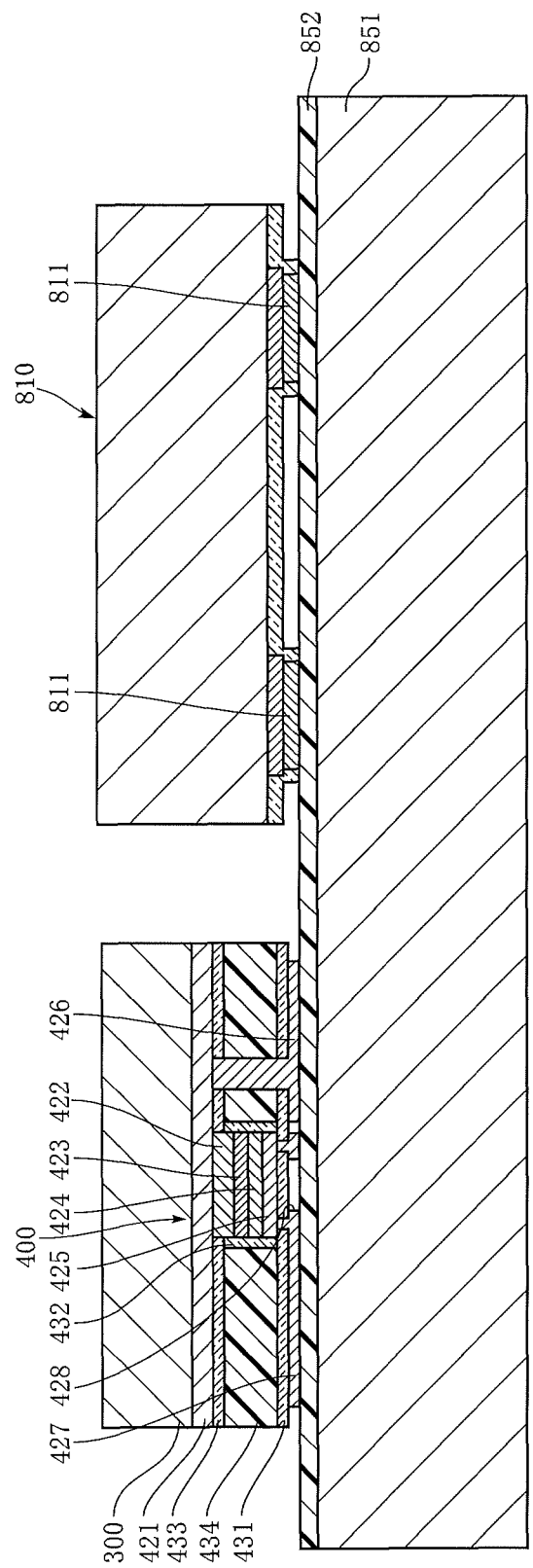
FIG. 36 is a cross-sectional view of principal parts for explaining a manufacturing method of an optical communication module according to a fourth embodiment of the present invention.
Figure 37:
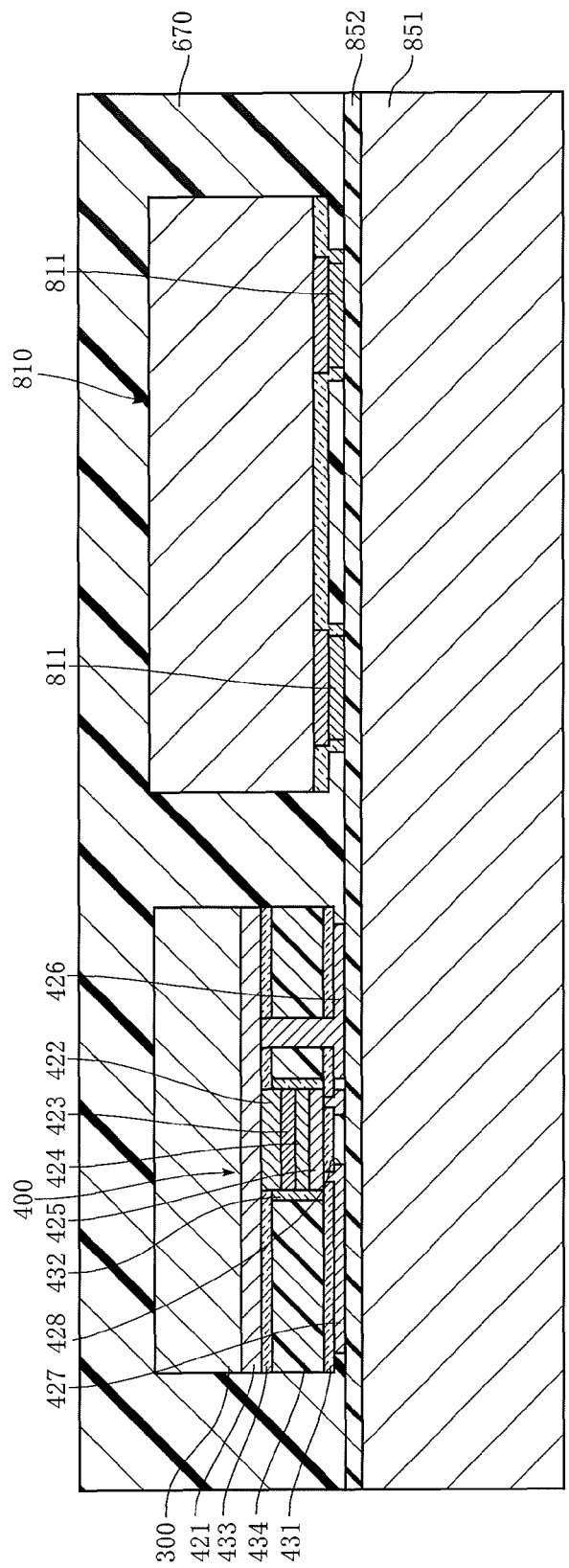
FIG. 37 is a cross-sectional view for explaining the manufacturing method of the optical communication module according to the fourth embodiment.
Figure 38:
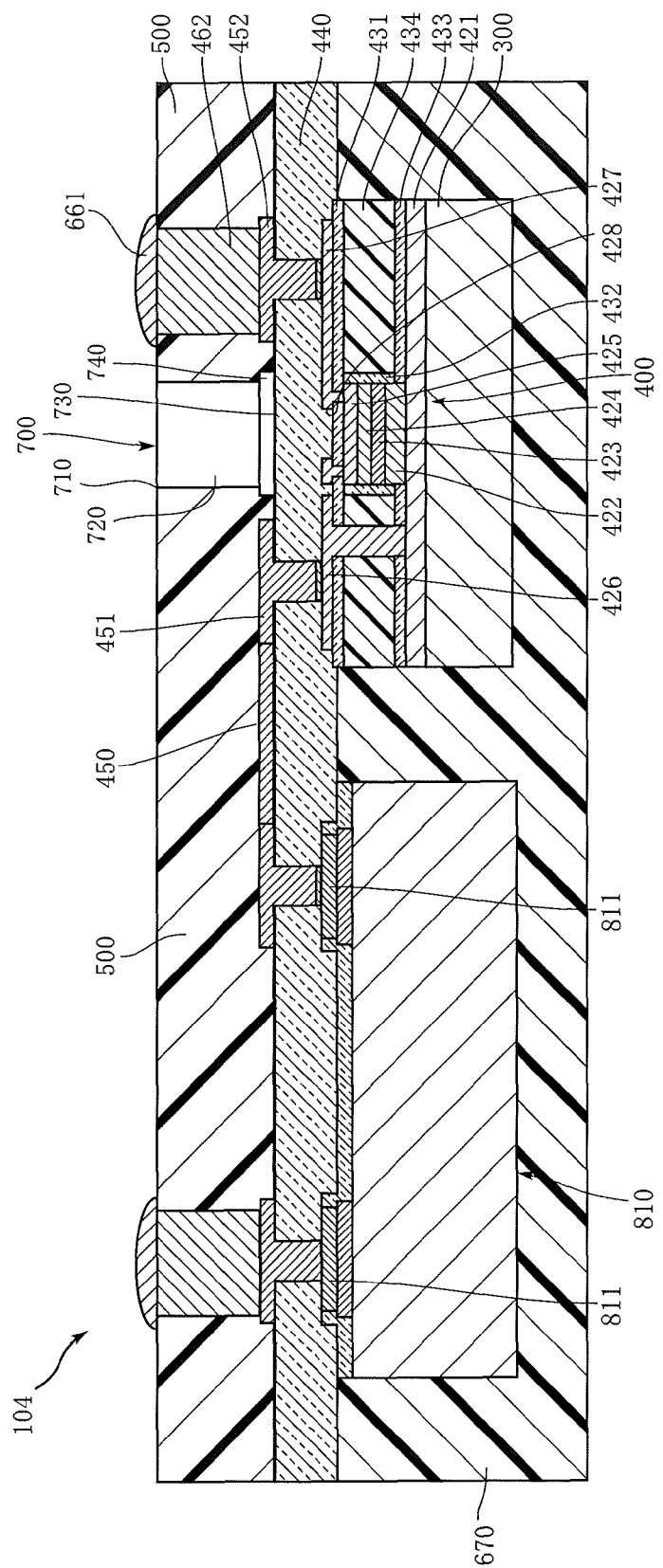
FIG. 38 is a cross-sectional view showing the optical communication module according to the fourth embodiment.

FIGS. 36 to 38 illustrate a manufacturing method of an optical communication module according to a fourth embodiment of the present invention. First, the intermediate product including the optical semiconductor element 400 mounted on the secondary substrate 300 as shown in FIG. 36 is formed by the process shown in FIGS. 1 through 12. Then, the intermediate product and the control IC 810 are attached to the support substrate 851 by the bonding layer 852.

As shown in FIG. 37, the third resin member 670 is formed so as to cover the intermediate product and the control IC 810, and then the support substrate 851 is removed. Thereafter, steps similar to those described referring to FIGS. 3, 4 and 26-34 are performed, so as to form the second dielectric transmission layer 440, the redistribution layer 450, the first resin member 500, the p-type electrode pillar 462, the fixing hole 700, and the external electrodes 661. Through such steps, an optical communication module 104 shown in FIG. 38 is obtained. The optical communication module 104 is configured as a bottom-view type module including the optical semiconductor element 400 and the control IC 810.

The method according to the above-noted embodiment also allows the optical communication module 104 to be manufactured with higher efficiency, and in a smaller size.

The optical communication module and the manufacturing method of the present invention are not limited to the foregoing embodiments. The configurations of the optical communication module and steps of the manufacturing method may be modified in various manners within the scope of the present invention.

The invention claimed is:

1. An optical communication module comprising:
an optical semiconductor element that includes: an optical functional region having a light receiving function or a light emitting function; a first transmission layer made of a material transmissive to light emitted from the optical functional region or light received by the optical functional region; and a wiring layer stacked on the first transmission layer and constituting a conduction path to the optical functional region;
a second transmission layer made of a material transmissive to the light and disposed to cover the optical semiconductor element;
a first resin member stacked on the second transmission layer; and
a fixing hole for fixing an optical fiber, the fixing hole including a bottom face provided by the second transmission layer, and an opening formed in an outer surface of the first resin member.

2. The optical communication module according to claim 1, wherein the bottom face and the optical functional region overlap each other when viewed in an axial direction of the fixing hole.

3. The optical communication module according to claim 1, further comprising an inner cylindrical portion connected to the opening, and a discontinuous portion located between the inner cylindrical portion and the bottom face, the discontinuous portion being discretely connected to the inner cylindrical portion.

4. The optical communication module according to claim 3, wherein the discontinuous portion is larger in cross-sectional size than the inner cylindrical portion.

5. The optical communication module according to claim 3, wherein the discontinuous portion is shorter in axial length than the inner cylindrical portion.

6. The optical communication module according to claim 3, wherein the inner cylindrical portion has a circular cross-sectional shape.

7. The optical communication module according to claim 6, wherein the inner cylindrical portion has a constant diameter.

8. The optical communication module according to claim 1, wherein the first resin member is non-transmissive to the light.

9. The optical communication module according to claim 1, wherein the wiring layer is formed with an opening for passing the light.

10. The optical communication module according to claim 1, further comprising a redistribution layer located between the second transmission layer and the first resin member, and electrically connected to the wiring layer.

11. The optical communication module according to claim 10, wherein the redistribution layer includes an internal electrode.

12. The optical communication module according to claim 11, further comprising an electrode pillar made of an electroconductive material, the electrode pillar being stacked on the internal electrode and extending in an axial direction of the fixing hole.

13. The optical communication module according to claim 12, wherein the electrode pillar is smaller in cross-sectional size than the internal electrode.

14. The optical communication module according to claim 1, further comprising a secondary substrate that supports the optical semiconductor element.

15. The optical communication module according to claim 14, wherein the secondary substrate is made of a semiconductor.

16. The optical communication module according to claim 1, further comprising a second resin member, wherein the second resin member covers at least a part of the first resin member and exposes the opening of the fixing hole.

17. The optical communication module according to claim 16, wherein the second resin member is non-transmissive to the light.

18. The optical communication module according to claim 16, wherein the second resin member includes a surface flush with a surface of the first resin member in which the opening of the fixing hole is formed.

19. The optical communication module according to claim 16, further comprising a control IC covered with the second resin member and electrically connected to the optical semiconductor element.

20. The optical communication module according to claim 19, wherein the optical semiconductor element and the control IC are arranged along a plane including an axial direction of the fixing hole.

21. The optical communication module according to claim 19, wherein the optical semiconductor element and the control IC are arranged along a plane perpendicular to the axial direction of the fixing hole.

22. The optical communication module according to claim 19, further comprising a main substrate for supporting the optical semiconductor element, the control IC, the first resin member, and the second resin member.

23. The optical communication module according to claim 22, further comprising a wire for electrically connecting the optical semiconductor element and the control IC to each other.

24. The optical communication module according to claim 19, further comprising an additional redistribution layer for electrically connecting the optical semiconductor element and the control IC each other.

25. A method of manufacturing an optical communication module, the method comprising the steps of:
preparing an optical semiconductor element that includes: an optical functional region having a light receiving function or a light emitting function; a first transmission layer made of a material transmissive to light emitted from the optical functional region or light received by the optical functional region; and a wiring layer stacked on the first transmission layer and constituting a conduction path to the optical functional region;
forming a second transmission layer and a redistribution layer, the second transmission layer being made of a material transmissive to the light and covering the first transmission layer and the wiring layer, the redistribution layer having a portion stacked on the second transmission layer, being electrically connected to the wiring layer, and including a cover portion for blocking the light;
forming a cover pillar standing upright on the cover portion;
forming a first resin intermediate covering the cover pillar;
forming a first resin member by collectively removing a part of the first resin intermediate and a part of the cover pillar, the first resin member being configured to expose a part of the cover pillar; and
removing the cover pillar and the cover portion.

26. The method according to claim 25, wherein the cover pillar is formed by a plating process performed in the forming step of the cover pillar.

27. The method according to claim 25, wherein the cover pillar and the cover portion are removed by an etching process performed in the removing step of the cover pillar and the cover portion.

28. The method according to claim 25, wherein the forming of the redistribution layer includes forming an internal electrode electrically connected to the optical semiconductor element, and the forming of the cover pillar includes collectively forming electrode pillars standing upright on internal electrodes, respectively.

29. The method according to claim 28, further comprising the step of selectively reducing a height of the electrode pillar alone after the forming of the cover pillar and before the forming of the first resin intermediate.

30. The method according to claim 29, further comprising the step of exposing a part of the cover pillar by collectively removing a part of the first resin intermediate and a part of the electrode pillar after the step of forming the first resin intermediate and before the step of removing the cover pillar and the cover portion.

31. The method according to claim 29, further comprising the step of exposing a part of the electrode pillar by collectively removing a part of the first resin intermediate and a part of the electrode pillar after the step of removing the cover pillar and the cover portion.

32. The method according to claim 30, wherein the step of exposing a part of the electrode pillar is performed by polishing.

* * * * *